US010267850B2

(12) United States Patent
Mao

(10) Patent No.: US 10,267,850 B2
(45) Date of Patent: Apr. 23, 2019

(54) RECONFIGURABLE TEST ACCESS PORT WITH FINITE STATE MACHINE CONTROL

(71) Applicant: Intel Corporation, Santa Clara, CA (US)

(72) Inventor: Cheng Mao, Shaanxi (CN)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/528,689

(22) PCT Filed: Dec. 22, 2014

(86) PCT No.: PCT/CN2014/094478
§ 371 (c)(1),
(2) Date: May 22, 2017

(87) PCT Pub. No.: WO2016/101090
PCT Pub. Date: Jun. 30, 2016

(65) Prior Publication Data
US 2017/0269157 A1 Sep. 21, 2017

(51) Int. Cl.
| G01R 31/28 | (2006.01) |
| G01R 31/317 | (2006.01) |
| G06F 11/22 | (2006.01) |
| G06F 11/27 | (2006.01) |
| G01R 31/3177 | (2006.01) |
| G06F 9/38 | (2018.01) |

(Continued)

(52) U.S. Cl.
CPC ... G01R 31/31701 (2013.01); G01R 31/3177 (2013.01); G01R 31/31705 (2013.01); G01R 31/31727 (2013.01); G06F 9/3887 (2013.01); G06F 11/2236 (2013.01); G06F 11/27 (2013.01); G06F 12/0875 (2013.01); G06F 12/0897 (2013.01); G06F 12/1027 (2013.01); G06F 13/4027 (2013.01); G06F 2212/452 (2013.01); G06F 2212/60 (2013.01); G06F 2212/68 (2013.01); G06F 2213/0026 (2013.01)

(58) Field of Classification Search
CPC ........ G01R 31/31701; G01R 31/31705; G01R 31/31727; G01R 31/3177; G06F 11/2236; G06F 11/27
USPC ......................................................... 714/727
See application file for complete search history.

(56) References Cited

U.S. PATENT DOCUMENTS

2006/0248426 A1* 11/2006 Miner ............ G01R 31/318552
714/741
2008/0148343 A1 6/2008 Taniguchi
(Continued)

FOREIGN PATENT DOCUMENTS

CN 102880536 1/2013

OTHER PUBLICATIONS

International Search Report and Written Opinion, Application No. PCT/CN2014/094478; 6 pgs., dated May 27, 2015.
(Continued)

Primary Examiner — Samir W Rizk
(74) Attorney, Agent, or Firm — Alliance IP, LLC

(57) ABSTRACT

A processor includes logic to implement a reconfigurable test access port with finite state machine control. A plurality of test access ports may each include a finite state machine for enabling implementation of different test interfaces to the processor, including JTAG IEEE 1149.1, JTAG IEEE 1149.7, and serial wire debug.

20 Claims, 26 Drawing Sheets

(51) Int. Cl.
  *G06F 12/0875*  (2016.01)
  *G06F 12/0897*  (2016.01)
  *G06F 12/1027*  (2016.01)
  *G06F 13/40*    (2006.01)

(56) References Cited

U.S. PATENT DOCUMENTS

| 2009/0228231 A1* | 9/2009 | Hakoo ........... G01R 31/318572 |
| | | 702/120 |
| 2011/0066907 A1 | 3/2011 | Whetsel |
| 2012/0150477 A1* | 6/2012 | Bruzzano ....... G01R 31/318536 |
| | | 702/120 |
| 2014/0053023 A1* | 2/2014 | Swoboda ............ G06F 11/2733 |
| | | 714/30 |

OTHER PUBLICATIONS

Intel Corporation, IA-32 Intel® Architecture Software Developer's Manual—vol. 2: Instruction Set Reference, 978 pages, 2003.

* cited by examiner

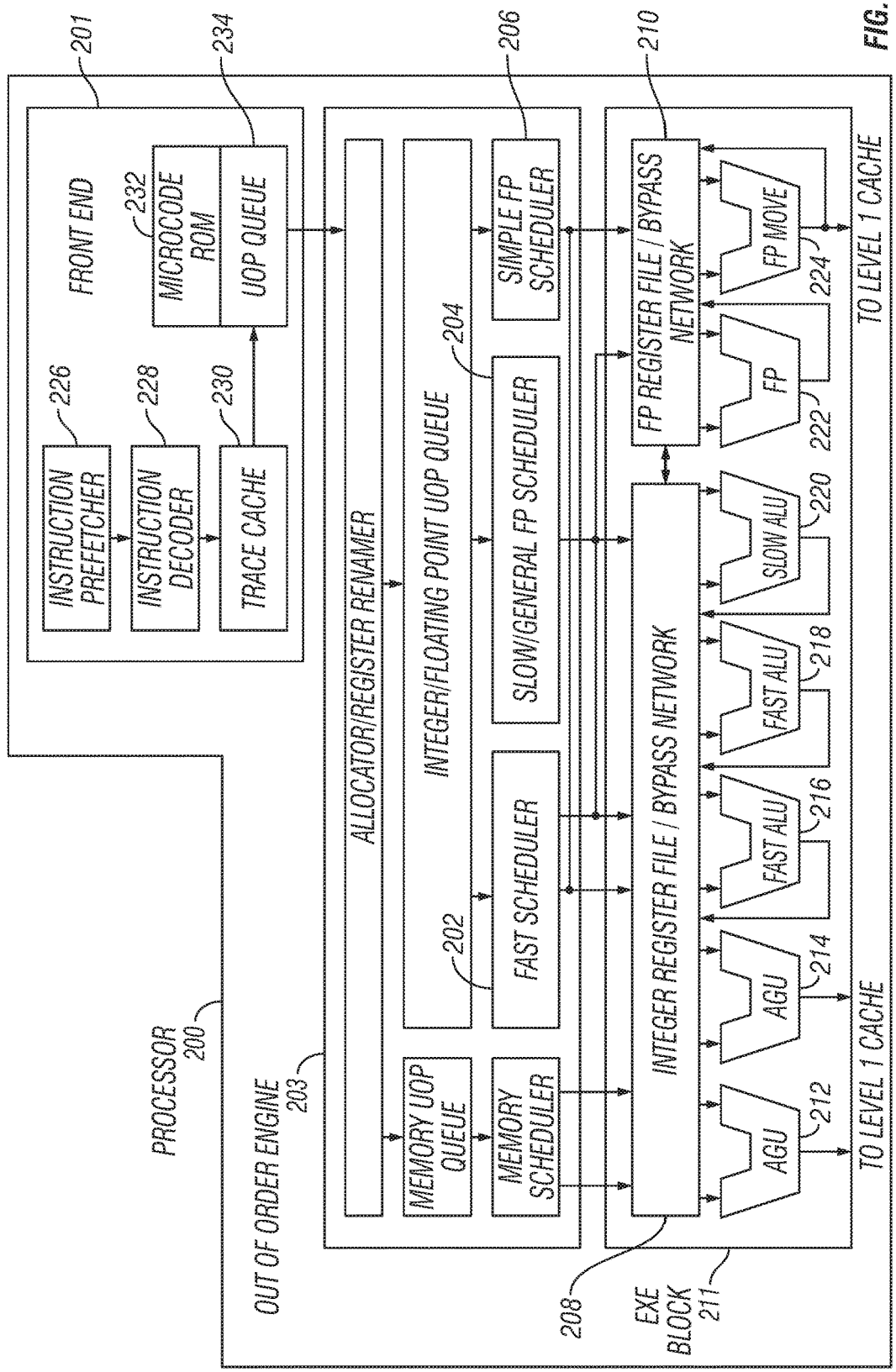

FIG. 3B

| 127 | 120 119 | 112 111 | 104 103 | | 24 23 | 16 15 | 8 7 | 0 |

| bbbb bbbb | bbbb bbbb | bbbb bbbb | • • • | bbbb bbbb | bbbb bbbb | bbbb bbbb |

UNSIGNED PACKED BYTE REPRESENTATION 344

| 127 | 120 119 | 112 111 | 104 103 | | 24 23 | 16 15 | 8 7 | 0 |

| sbbb bbbb | sbbb bbbb | sbbb bbbb | • • • | sbbb bbbb | sbbb bbbb | sbbb bbbb |

SIGNED PACKED BYTE REPRESENTATION 345

| 127 | 112 111 | | 16 15 | 0 |

| wwww wwww wwww wwww | • • • | wwww wwww wwww wwww |

UNSIGNED PACKED WORD REPRESENTATION 346

| 127 | 112 111 | | 16 15 | 0 |

| swww wwww wwww wwww | • • • | swww wwww wwww wwww |

SIGNED PACKED WORD REPRESENTATION 347

| 127 | 92 91 | 32 31 | 0 |

| dddd dddd dddd dddd dddd dddd dddd dddd | • • • | dddd dddd dddd dddd dddd dddd dddd dddd |

UNSIGNED PACKED DOUBLEWORD REPRESENTATION 348

| 127 | 92 91 | 32 31 | 0 |

| sddd dddd dddd dddd dddd dddd dddd dddd | • • • | sddd dddd dddd dddd dddd dddd dddd dddd |

SIGNED PACKED DOUBLEWORD REPRESENTATION 349

| 31 | 16 15 | 8 7 | 6 5 | 32 | 0 |
|---|---|---|---|---|---|
| 361 | 362 | 363 | 364 | 365 | |

| 39 | 32 31 | 16 15 | 8 7 | 6 5 | 32 | 0 |
|---|---|---|---|---|---|---|
| 378 | 371 | 372 | 373 | 374 | 375 | |

| 31 | 28 27 | 24 23 | 22 21 | 20 19 | 16 15 | 12 11 | 8 7 | 6 5 | 4 | 3 | 0 |
|---|---|---|---|---|---|---|---|---|---|---|---|
| 381 | 382 | 383 | 384 | 385 | 386 | 387 | 388 | 389 | 390 | | |

380

RECONFIGURABLE TEST ACCESS PORT WITH FINITE STATE MACHINE CONTROL

CROSS-REFERENCED TO RELATED APPLICATIONS

This application is a U.S. National Stage Application of International Application No. PCT/CN2014/094478 filed Dec. 22, 2014, which designates the United States, and which is incorporated by reference in its entirety for all purposes.

FIELD OF THE INVENTION

The present disclosure pertains to the field of processing logic, microprocessors, and associated instruction set architecture that, when executed by the processor or other processing logic, perform logical, mathematical, or other functional operations.

DESCRIPTION OF RELATED ART

Microprocessors (or simply "processors") may support external testing through test access ports that can be used for debugging processor functionality. One standard for processor test access is the Joint Test Action Group (JTAG) standard, also known as IEEE 1149.1 Standard Test Access Port and Boundary-Scan Architecture, which may be implemented using four interface pins and one optional pin. Other standards for processor test access using two pins include JTAG (IEEE 1149.7) and Serial Wire Debug (SWD) by ARM Holdings, Ltd. (ARM Debug Interface v5). Because of architectural differences among such standards, interoperability of a processor test access port with different external debugging tools may be limited.

DESCRIPTION OF THE FIGURES

Embodiments are illustrated by way of example and not limitation in the Figures of the accompanying drawings:

FIG. 2 is a block diagram of the micro-architecture for a processor that may include logic circuits to perform instructions, in accordance with embodiments of the present disclosure;

FIG. 3B illustrates possible in-register data storage formats, in accordance with embodiments of the present disclosure;

FIG. 3C illustrates various signed and unsigned packed data type representations in multimedia registers, in accordance with embodiments of the present disclosure;

FIG. 3D illustrates an embodiment of an operation encoding format;

FIG. 3E illustrates another possible operation encoding format having forty or more bits, in accordance with embodiments of the present disclosure;

FIG. 3F illustrates yet another possible operation encoding format, in accordance with embodiments of the present disclosure;

DETAILED DESCRIPTION

Figure 1A:
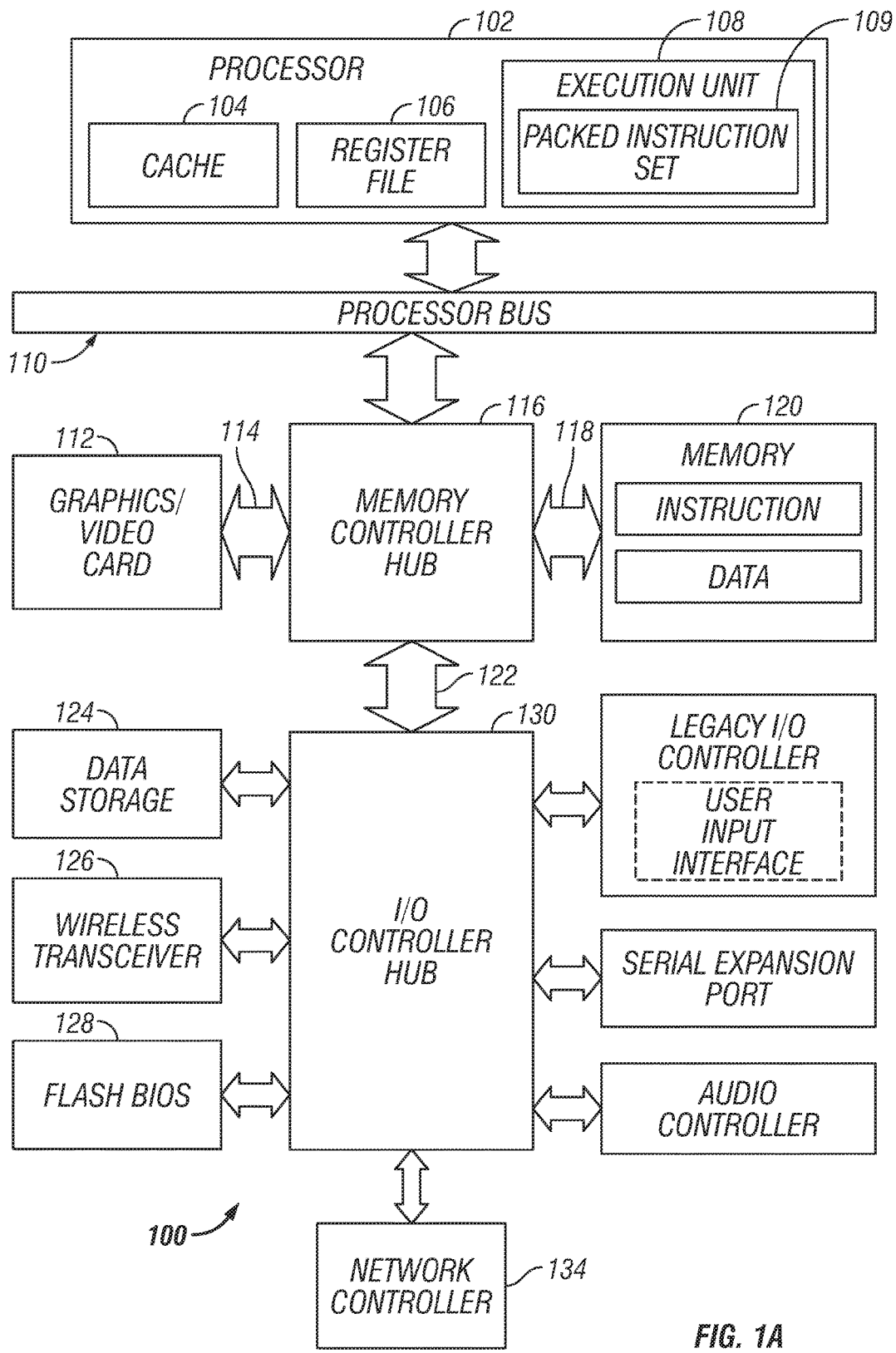
FIG. 1A is a block diagram of an exemplary computer system formed with a processor that may include execution units to execute an instruction, in accordance with embodiments of the present disclosure.

The following description describes processing logic in a processor for implementing a reconfigurable test access port with finite state machine control. In the following description, numerous specific details such as processing logic, processor types, micro-architectural conditions, events, enablement mechanisms, and the like are set forth in order to provide a more thorough understanding of embodiments of the present disclosure. It will be appreciated, however, by one skilled in the art that the embodiments may be practiced without such specific details. Additionally, some well-known structures, circuits, and the like have not been shown in detail to avoid unnecessarily obscuring embodiments of the present disclosure.

Although the following embodiments are described with reference to a processor, other embodiments are applicable to other types of integrated circuits and logic devices. Similar techniques and teachings of embodiments of the present disclosure may be applied to other types of circuits or semiconductor devices that may benefit from higher pipeline throughput and improved performance. The teachings of embodiments of the present disclosure are applicable to any processor or machine that performs data manipulations. However, the embodiments are not limited to processors or machines that perform 512-bit, 256-bit, 128-bit, 64-bit, 32-bit, or 16-bit data operations and may be applied to any processor and machine in which manipulation or management of data may be performed. In addition, the following description provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure may be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions may be used to cause a general-purpose or special-purpose processor that may be programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Furthermore, steps of embodiments of the present disclosure might be performed by specific hardware components that contain fixed-function logic for performing the steps, or by any combination of programmed computer components and fixed-function hardware components.

Instructions used to program logic to perform embodiments of the present disclosure may be stored within a memory in the system, such as DRAM, cache, flash memory, or other storage. Furthermore, the instructions may be distributed via a network or by way of other computer-readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium may include any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as may be useful in simulations, the hardware may be represented using a hardware description language or another functional description language. Additionally, a circuit level model with logic and/or transistor gates may be produced at some stages of the design process. Furthermore, designs, at some stage, may reach a level of data representing the physical placement of various devices in the hardware model. In cases where some semiconductor fabrication techniques are used, the data representing the hardware model may be the data specifying the presence or absence of various features on different mask layers for masks used to produce the integrated circuit. In any representation of the design, the data may be stored in any form of a machine-readable medium. A memory or a magnetic or optical storage such as a disc may be the machine-readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy may be made. Thus, a communication provider or a network provider may store on a tangible, machine-readable medium, at least temporarily, an article, such as information encoded into a carrier wave, embodying techniques of embodiments of the present disclosure.

In modern processors, a number of different execution units may be used to process and execute a variety of code and instructions. Some instructions may be quicker to complete while others may take a number of clock cycles to complete. The faster the throughput of instructions, the better the overall performance of the processor. Thus it would be advantageous to have as many instructions execute as fast as possible. However, there may be certain instructions that have greater complexity and require more in terms of execution time and processor resources, such as floating point instructions, load/store operations, data moves, etc.

As more computer systems are used in internet, text, and multimedia applications, additional processor support has been introduced over time. In one embodiment, an instruction set may be associated with one or more computer architectures, including data types, instructions, register architecture, addressing modes, memory architecture, interrupt and exception handling, and external input and output (I/O).

In one embodiment, the instruction set architecture (ISA) may be implemented by one or more micro-architectures, which may include processor logic and circuits used to implement one or more instruction sets. Accordingly, processors with different micro-architectures may share at least a portion of a common instruction set. For example, Intel® Pentium 4 processors, Intel® Core™ processors, and processors from Advanced Micro Devices, Inc. of Sunnyvale Calif. implement nearly identical versions of the x86 instruction set (with some extensions that have been added with newer versions), but have different internal designs. Similarly, processors designed by other processor development companies, such as ARM Holdings, Ltd., MIPS, or their licensees or adopters, may share at least a portion a common instruction set, but may include different processor designs. For example, the same register architecture of the ISA may be implemented in different ways in different micro-architectures using new or well-known techniques, including dedicated physical registers, one or more dynamically allocated physical registers using a register renaming mechanism (e.g., the use of a Register Alias Table (RAT), a Reorder Buffer (ROB) and a retirement register file. In one embodiment, registers may include one or more registers, register architectures, register files, or other register sets that may or may not be addressable by a software programmer.

An instruction may include one or more instruction formats. In one embodiment, an instruction format may indicate various fields (number of bits, location of bits, etc.) to specify, among other things, the operation to be performed and the operands on which that operation will be performed. In a further embodiment, some instruction formats may be further defined by instruction templates (or sub-formats). For example, the instruction templates of a given instruction format may be defined to have different subsets of the instruction format's fields and/or defined to have a given field interpreted differently. In one embodiment, an instruction may be expressed using an instruction format (and, if defined, in a given one of the instruction templates of that instruction format) and specifies or indicates the operation and the operands upon which the operation will operate.

Scientific, financial, auto-vectorized general purpose, RMS (recognition, mining, and synthesis), and visual and multimedia applications (e.g., 2D/3D graphics, image processing, video compression/decompression, voice recognition algorithms and audio manipulation) may require the same operation to be performed on a large number of data items. In one embodiment, Single Instruction Multiple Data (SIMD) refers to a type of instruction that causes a processor to perform an operation on multiple data elements. SIMD technology may be used in processors that may logically divide the bits in a register into a number of fixed-sized or variable-sized data elements, each of which represents a separate value. For example, in one embodiment, the bits in a 64-bit register may be organized as a source operand containing four separate 16-bit data elements, each of which represents a separate 16-bit value. This type of data may be referred to as 'packed' data type or 'vector' data type, and operands of this data type may be referred to as packed data operands or vector operands. In one embodiment, a packed data item or vector may be a sequence of packed data elements stored within a single register, and a packed data operand or a vector operand may a source or destination operand of a SIMD instruction (or 'packed data instruction' or a 'vector instruction'). In one embodiment, a SIMD instruction specifies a single vector operation to be performed on two source vector operands to generate a destination vector operand (also referred to as a result vector operand) of the same or different size, with the same or different number of data elements, and in the same or different data element order.

SIMD technology, such as that employed by the Intel® Core™ processors having an instruction set including x86, MMX™ Streaming SIMD Extensions (SSE), SSE2, SSE3, SSE4.1, and SSE4.2 instructions, ARM processors, such as the ARM Cortex® family of processors having an instruction set including the Vector Floating Point (VFP) and/or NEON instructions, and MIPS processors, such as the Loongson family of processors developed by the Institute of Computing Technology (ICT) of the Chinese Academy of Sciences, has enabled a significant improvement in application performance (Core™ and MMX™ are registered trademarks of Intel Corporation of Santa Clara, Calif.).

In one embodiment, destination and source registers/data may be generic terms to represent the source and destination of the corresponding data or operation. In some embodiments, they may be implemented by registers, memory, or other storage areas having other names or functions than those depicted. For example, in one embodiment, "DEST1" may be a temporary storage register or other storage area, whereas "SRC1" and "SRC2" may be a first and second source storage register or other storage area, and so forth. In other embodiments, two or more of the SRC and DEST storage areas may correspond to different data storage elements within the same storage area (e.g., a SIMD register). In one embodiment, one of the source registers may also act as a destination register by, for example, writing back the result of an operation performed on the first and second source data to one of the two source registers serving as a destination registers.

FIG. 1A is a block diagram of an exemplary computer system formed with a processor that may include execution units to execute an instruction, in accordance with embodiments of the present disclosure. System 100 may include a component, such as a processor 102 to employ execution units including logic to perform algorithms for process data, in accordance with the present disclosure, such as in the embodiment described herein. System 100 may be representative of processing systems based on the PENTIUM® III, PENTIUM® 4, Xeon™, Itanium®, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 100 may execute a version of the WINDOWS™ operating system available from Microsoft Corporation of Redmond, Wash., although other operating systems (UNIX and Linux for example), embedded software, and/or graphical user interfaces, may also be used. Thus, embodiments of the present disclosure are not limited to any specific combination of hardware circuitry and software.

Embodiments are not limited to computer systems. Embodiments of the present disclosure may be used in other devices such as handheld devices and embedded applications. Some examples of handheld devices include cellular phones, Internet Protocol devices, digital cameras, personal digital assistants (PDAs), and handheld PCs. Embedded applications may include a micro controller, a digital signal processor (DSP), system on a chip, network computers (NetPC), set-top boxes, network hubs, wide area network (WAN) switches, or any other system that may perform one or more instructions in accordance with at least one embodiment.

Computer system 100 may include a processor 102 that may include one or more execution units 108 to perform an algorithm to perform at least one instruction in accordance with one embodiment of the present disclosure. One embodiment may be described in the context of a single processor desktop or server system, but other embodiments may be included in a multiprocessor system. System 100 may be an example of a 'hub' system architecture. System 100 may include a processor 102 for processing data signals. Processor 102 may include a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. In one embodiment, processor 102 may be coupled to a processor bus 110 that may transmit data signals between processor 102 and other components in system 100. The elements of system 100 may perform conventional functions that are well known to those familiar with the art.

In one embodiment, processor 102 may include a Level 1 (L1) internal cache memory 104. Depending on the architecture, the processor 102 may have a single internal cache or multiple levels of internal cache. In another embodiment, the cache memory may reside external to processor 102. Other embodiments may also include a combination of both internal and external caches depending on the particular implementation and needs. Register file 106 may store different types of data in various registers including integer registers, floating point registers, status registers, and instruction pointer register.

Execution unit 108, including logic to perform integer and floating point operations, also resides in processor 102. Processor 102 may also include a microcode (ucode) ROM that stores microcode for certain macroinstructions. In one embodiment, execution unit 108 may include logic to handle a packed instruction set 109. By including the packed instruction set 109 in the instruction set of a general-purpose processor 102, along with associated circuitry to execute the instructions, the operations used by many multimedia applications may be performed using packed data in a general-purpose processor 102. Thus, many multimedia applications may be accelerated and executed more efficiently by using the full width of a processor's data bus for performing operations on packed data. This may eliminate the need to transfer smaller units of data across the processor's data bus to perform one or more operations one data element at a time.

Embodiments of an execution unit 108 may also be used in micro controllers, embedded processors, graphics devices, DSPs, and other types of logic circuits. System 100 may include a memory 120. Memory 120 may be implemented as a dynamic random access memory (DRAM) device, a static random access memory (SRAM) device, flash memory device, or other memory device. Memory 120 may store instructions and/or data represented by data signals that may be executed by processor 102.

A system logic chip 116 may be coupled to processor bus 110 and memory 120. System logic chip 116 may include a memory controller hub (MCH). Processor 102 may communicate with MCH 116 via a processor bus 110. MCH 116 may provide a high bandwidth memory path 118 to memory 120 for instruction and data storage and for storage of graphics commands, data and textures. MCH 116 may direct data signals between processor 102, memory 120, and other components in system 100 and to bridge the data signals between processor bus 110, memory 120, and system I/O 122. In some embodiments, the system logic chip 116 may provide a graphics port for coupling to a graphics controller 112. MCH 116 may be coupled to memory 120 through a memory interface 118. Graphics card 112 may be coupled to MCH 116 through an Accelerated Graphics Port (AGP) interconnect 114.

System 100 may use a proprietary hub interface bus 122 to couple MCH 116 to I/O controller hub (ICH) 130. In one embodiment, ICH 130 may provide direct connections to some I/O devices via a local I/O bus. The local I/O bus may include a high-speed I/O bus for connecting peripherals to memory 120, chipset, and processor 102. Examples may include the audio controller, firmware hub (flash BIOS) 128, wireless transceiver 126, data storage 124, legacy I/O controller containing user input and keyboard interfaces, a serial expansion port such as Universal Serial Bus (USB), and a network controller 134. Data storage device 124 may comprise a hard disk drive, a floppy disk drive, a CD-ROM device, a flash memory device, or other mass storage device.

For another embodiment of a system, an instruction in accordance with one embodiment may be used with a system on a chip. One embodiment of a system on a chip comprises of a processor and a memory. The memory for one such system may include a flash memory. The flash memory may be located on the same die as the processor and other system components. Additionally, other logic blocks such as a memory controller or graphics controller may also be located on a system on a chip.

Figure 1B:
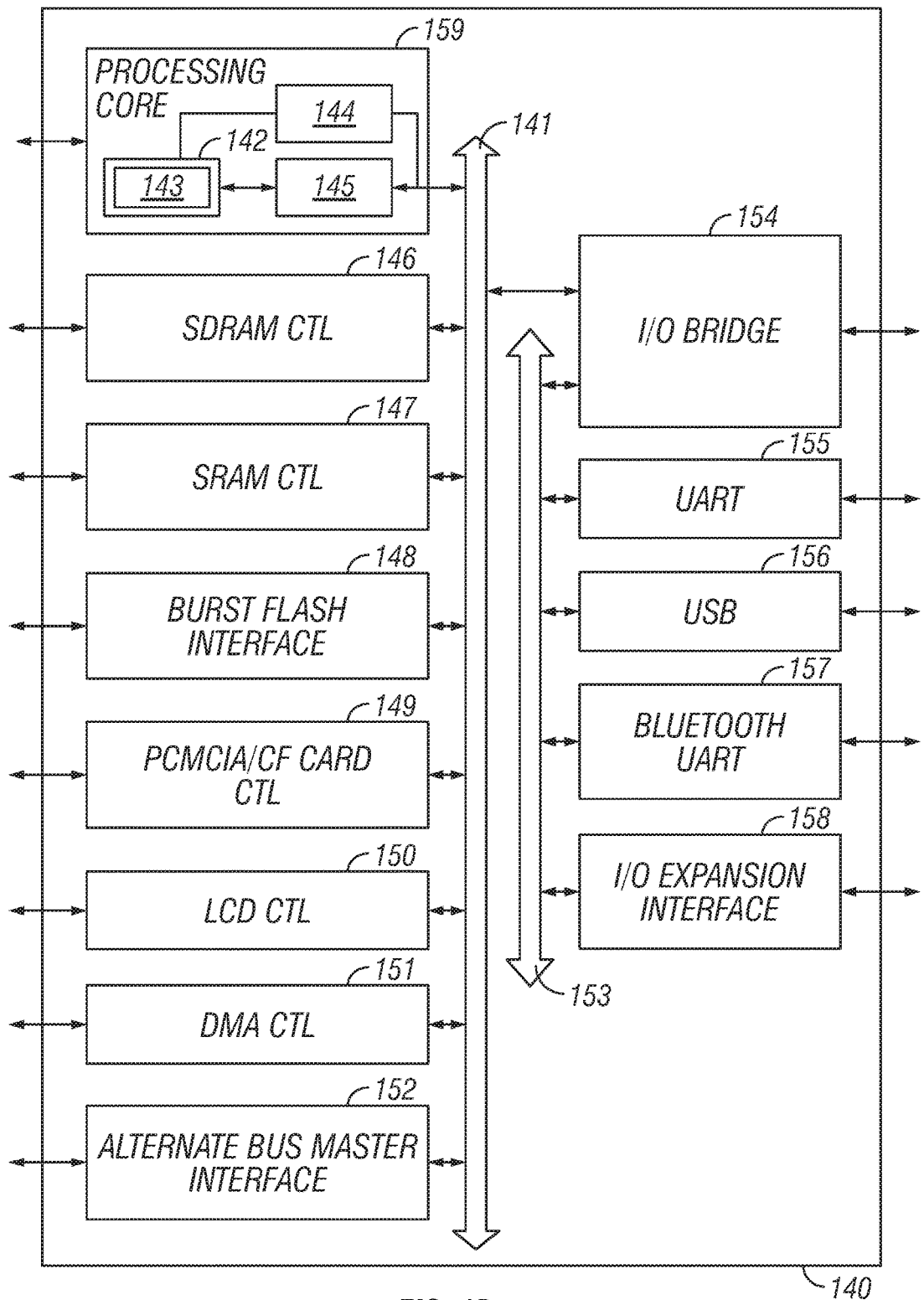
FIG. 1B illustrates a data processing system, in accordance with embodiments of the present disclosure.

FIG. 1B illustrates a data processing system 140 which implements the principles of embodiments of the present disclosure. It will be readily appreciated by one of skill in the art that the embodiments described herein may operate with alternative processing systems without departure from the scope of embodiments of the disclosure.

Computer system 140 comprises a processing core 159 for performing at least one instruction in accordance with one embodiment. In one embodiment, processing core 159 represents a processing unit of any type of architecture, including but not limited to a CISC, a RISC or a VLIW type architecture. Processing core 159 may also be suitable for manufacture in one or more process technologies and by being represented on a machine-readable media in sufficient detail, may be suitable to facilitate said manufacture.

Processing core 159 comprises an execution unit 142, a set of register files 145, and a decoder 144. Processing core 159 may also include additional circuitry (not shown) which may be unnecessary to the understanding of embodiments of the present disclosure. Execution unit 142 may execute instructions received by processing core 159. In addition to performing typical processor instructions, execution unit 142 may perform instructions in packed instruction set 143 for performing operations on packed data formats. Packed instruction set 143 may include instructions for performing embodiments of the disclosure and other packed instructions. Execution unit 142 may be coupled to register file 145 by an internal bus. Register file 145 may represent a storage area on processing core 159 for storing information, including data. As previously mentioned, it is understood that the storage area may store the packed data might not be critical. Execution unit 142 may be coupled to decoder 144. Decoder 144 may decode instructions received by processing core 159 into control signals and/or microcode entry points. In response to these control signals and/or microcode entry points, execution unit 142 performs the appropriate operations. In one embodiment, the decoder may interpret the opcode of the instruction, which will indicate what operation should be performed on the corresponding data indicated within the instruction.

Processing core 159 may be coupled with bus 141 for communicating with various other system devices, which may include but are not limited to, for example, synchronous dynamic random access memory (SDRAM) control 146, static random access memory (SRAM) control 147, burst flash memory interface 148, personal computer memory card international association (PCMCIA)/compact flash (CF) card control 149, liquid crystal display (LCD) control 150, direct memory access (DMA) controller 151, and alternative bus master interface 152. In one embodiment, data processing system 140 may also comprise an I/O bridge 154 for communicating with various I/O devices via an I/O bus 153. Such I/O devices may include but are not limited to, for example, universal asynchronous receiver/transmitter (UART) 155, universal serial bus (USB) 156, Bluetooth wireless UART 157 and I/O expansion interface 158.

One embodiment of data processing system 140 provides for mobile, network and/or wireless communications and a processing core 159 that may perform SIMD operations including a text string comparison operation. Processing core 159 may be programmed with various audio, video, imaging and communications algorithms including discrete transformations such as a Walsh-Hadamard transform, a fast Fourier transform (FFT), a discrete cosine transform (DCT), and their respective inverse transforms; compression/decompression techniques such as color space transformation, video encode motion estimation or video decode motion compensation; and modulation/demodulation (MODEM) functions such as pulse coded modulation (PCM).

Figure 1C:
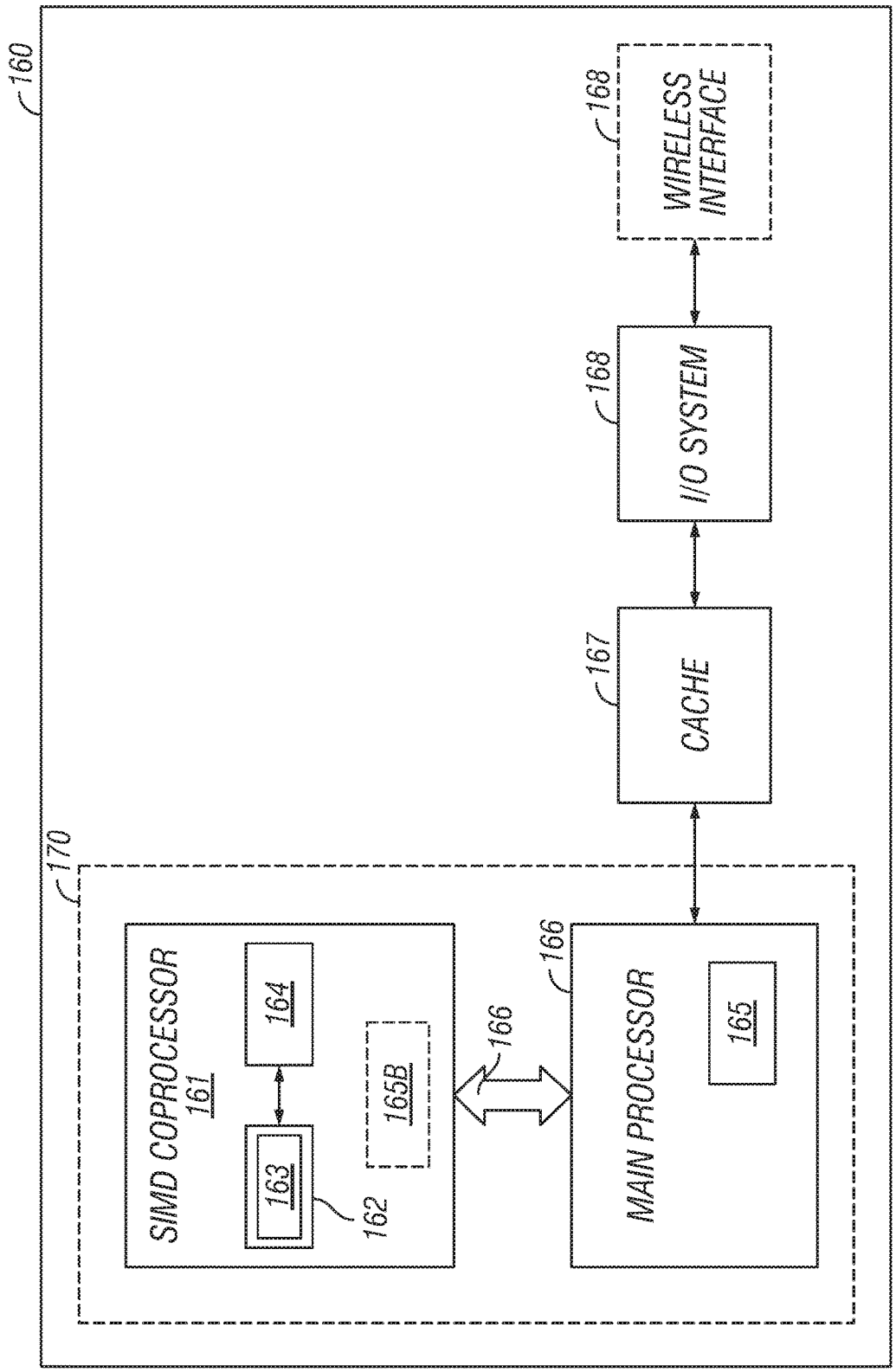
FIG. 1C illustrates other embodiments of a data processing system for performing text string comparison operations.

FIG. 1C illustrates other embodiments of a data processing system that performs SIMD text string comparison operations. In one embodiment, data processing system 160 may include a main processor 166, a SIMD coprocessor 161, a cache memory 167, and an input/output system 168. Input/output system 168 may optionally be coupled to a wireless interface 169. SIMD coprocessor 161 may perform operations including instructions in accordance with one embodiment. In one embodiment, processing core 170 may be suitable for manufacture in one or more process technologies and by being represented on a machine-readable media in sufficient detail, may be suitable to facilitate the manufacture of all or part of data processing system 160 including processing core 170.

In one embodiment, SIMD coprocessor 161 comprises an execution unit 162 and a set of register files 164. One embodiment of main processor 165 comprises a decoder 165 to recognize instructions of instruction set 163 including instructions in accordance with one embodiment for execution by execution unit 162. In other embodiments, SIMD coprocessor 161 also comprises at least part of decoder 165 to decode instructions of instruction set 163. Processing core 170 may also include additional circuitry (not shown) which may be unnecessary to the understanding of embodiments of the present disclosure.

In operation, main processor 166 executes a stream of data processing instructions that control data processing operations of a general type including interactions with cache memory 167, and input/output system 168. Embedded within the stream of data processing instructions may be SIMD coprocessor instructions. Decoder 165 of main processor 166 recognizes these SIMD coprocessor instructions as being of a type that should be executed by an attached SIMD coprocessor 161. Accordingly, main processor 166 issues these SIMD coprocessor instructions (or control signals representing SIMD coprocessor instructions) on the coprocessor bus 166. From coprocessor bus 166, these instructions may be received by any attached SIMD coprocessors. In this case, SIMD coprocessor 161 may accept and execute any received SIMD coprocessor instructions intended for it.

Data may be received via wireless interface 169 for processing by the SIMD coprocessor instructions. For one example, voice communication may be received in the form of a digital signal, which may be processed by the SIMD coprocessor instructions to regenerate digital audio samples representative of the voice communications. For another example, compressed audio and/or video may be received in the form of a digital bit stream, which may be processed by the SIMD coprocessor instructions to regenerate digital audio samples and/or motion video frames. In one embodiment of processing core 170, main processor 166, and a SIMD coprocessor 161 may be integrated into a single processing core 170 comprising an execution unit 162, a set of register files 164, and a decoder 165 to recognize instructions of instruction set 163 including instructions in accordance with one embodiment.

FIG. 2 is a block diagram of the micro-architecture for a processor 200 that may include logic circuits to perform instructions, in accordance with embodiments of the present disclosure. In some embodiments, an instruction in accordance with one embodiment may be implemented to operate on data elements having sizes of byte, word, doubleword, quadword, etc., as well as datatypes, such as single and double precision integer and floating point datatypes. In one embodiment, in-order front end 201 may implement a part of processor 200 that may fetch instructions to be executed and prepares the instructions to be used later in the processor pipeline. Front end 201 may include several units. In one embodiment, instruction prefetcher 226 fetches instructions from memory and feeds the instructions to an instruction decoder 228 which in turn decodes or interprets the instructions. For example, in one embodiment, the decoder decodes a received instruction into one or more operations called "micro-instructions" or "micro-operations" (also called micro op or uops) that the machine may execute. In other embodiments, the decoder parses the instruction into an opcode and corresponding data and control fields that may be used by the micro-architecture to perform operations in accordance with one embodiment. In one embodiment, trace cache 230 may assemble decoded uops into program ordered sequences or traces in uop queue 234 for execution. When trace cache 230 encounters a complex instruction, microcode ROM 232 provides the uops needed to complete the operation.

Some instructions may be converted into a single micro-op, whereas others need several micro-ops to complete the full operation. In one embodiment, if more than four micro-ops are needed to complete an instruction, decoder 228 may access microcode ROM 232 to perform the instruction. In one embodiment, an instruction may be decoded into a small number of micro ops for processing at instruction decoder 228. In another embodiment, an instruction may be stored within microcode ROM 232 should a number of micro-ops be needed to accomplish the operation. Trace cache 230 refers to an entry point programmable logic array (PLA) to determine a correct micro-instruction pointer for reading the micro-code sequences to complete one or more instructions in accordance with one embodiment from micro-code ROM 232. After microcode ROM 232 finishes sequencing micro-ops for an instruction, front end 201 of the machine may resume fetching micro-ops from trace cache 230.

Out-of-order execution engine 203 may prepare instructions for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 202, slow/general floating point scheduler 204, and simple floating point scheduler 206. Uop schedulers 202, 204, 206, determine when a uop is ready to execute based on the readiness of their dependent input register operand sources and the availability of the execution resources the uops need to complete their operation. Fast scheduler 202 of one embodiment may schedule on each half of the main clock cycle while the other schedulers may only schedule once per main processor clock cycle. The schedulers arbitrate for the dispatch ports to schedule uops for execution.

Register files 208, 210 may be arranged between schedulers 202, 204, 206, and execution units 212, 214, 216, 218, 220, 222, 224 in execution block 211. Each of register files 208, 210 perform integer and floating point operations, respectively. Each register file 208, 210, may include a bypass network that may bypass or forward just completed results that have not yet been written into the register file to new dependent uops. Integer register file 208 and floating point register file 210 may communicate data with the other. In one embodiment, integer register file 208 may be split into two separate register files, one register file for low-order thirty-two bits of data and a second register file for high order thirty-two bits of data. Floating point register file 210 may include 128-bit wide entries because floating point instructions typically have operands from 64 to 128 bits in width.

Execution block 211 may contain execution units 212, 214, 216, 218, 220, 222, 224. Execution units 212, 214, 216, 218, 220, 222, 224 may execute the instructions. Execution block 211 may include register files 208, 210 that store the integer and floating point data operand values that the micro-instructions need to execute. In one embodiment, processor 200 may comprise a number of execution units: address generation unit (AGU) 212, AGU 214, fast ALU 216, fast ALU 218, slow ALU 220, floating point ALU 222, floating point move unit 224. In another embodiment, floating point execution blocks 222, 224, may execute floating point, MMX, SIMD, and SSE, or other operations. In yet another embodiment, floating point ALU 222 may include a 64-bit by 64-bit floating point divider to execute divide, square root, and remainder micro-ops. In various embodiments, instructions involving a floating point value may be handled with the floating point hardware. In one embodiment, ALU operations may be passed to high-speed ALU execution units 216, 218. High-speed ALUs 216, 218 may execute fast operations with an effective latency of half a clock cycle. In one embodiment, most complex integer operations go to slow ALU 220 as slow ALU 220 may include integer execution hardware for long latency type of operations, such as a multiplier, shifts, flag logic, and branch processing. Memory load/store operations may be executed by AGUs 212, 214. In one embodiment, integer ALUs 216, 218, 220 may perform integer operations on 64-bit data operands. In other embodiments, ALUs 216, 218, 220 may be implemented to support a variety of data bit sizes including sixteen, thirty-two, 128, 256, etc. Similarly, floating point units 222, 224 may be implemented to support a range of operands having bits of various widths. In one embodiment, floating point units 222, 224, may operate on 128-bit wide packed data operands in conjunction with SIMD and multimedia instructions.

In one embodiment, uops schedulers 202, 204, 206, dispatch dependent operations before the parent load has finished executing. As uops may be speculatively scheduled and executed in processor 200, processor 200 may also include logic to handle memory misses. If a data load misses in the data cache, there may be dependent operations in flight in the pipeline that have left the scheduler with temporarily incorrect data. A replay mechanism tracks and re-executes instructions that use incorrect data. Only the dependent operations might need to be replayed and the independent ones may be allowed to complete. The schedulers and replay mechanism of one embodiment of a processor may also be designed to catch instruction sequences for text string comparison operations.

The term "registers" may refer to the on-board processor storage locations that may be used as part of instructions to identify operands. In other words, registers may be those that may be usable from the outside of the processor (from a programmer's perspective). However, in some embodiments registers might not be limited to a particular type of circuit. Rather, a register may store data, provide data, and perform the functions described herein. The registers described herein may be implemented by circuitry within a processor using any number of different techniques, such as dedicated physical registers, dynamically allocated physical registers using register renaming, combinations of dedicated and dynamically allocated physical registers, etc. In one embodiment, integer registers store 32-bit integer data. A register file of one embodiment also contains eight multimedia SIMD registers for packed data. For the discussions below, the registers may be understood to be data registers designed to hold packed data, such as 64-bit wide MMX™ registers (also referred to as 'mm' registers in some instances) in microprocessors enabled with MMX technology from Intel Corporation of Santa Clara, Calif. These MMX registers, available in both integer and floating point forms, may operate with packed data elements that accompany SIMD and SSE instructions. Similarly, 128-bit wide XMM registers relating to SSE2, SSE3, SSE4, or beyond (referred to generically as "SSEx") technology may hold such packed data operands. In one embodiment, in storing packed data and integer data, the registers do not need to differentiate between the two data types. In one embodiment, integer and floating point may be contained in the same register file or different register files. Furthermore, in one embodiment, floating point and integer data may be stored in different registers or the same registers.

Figure 3A:
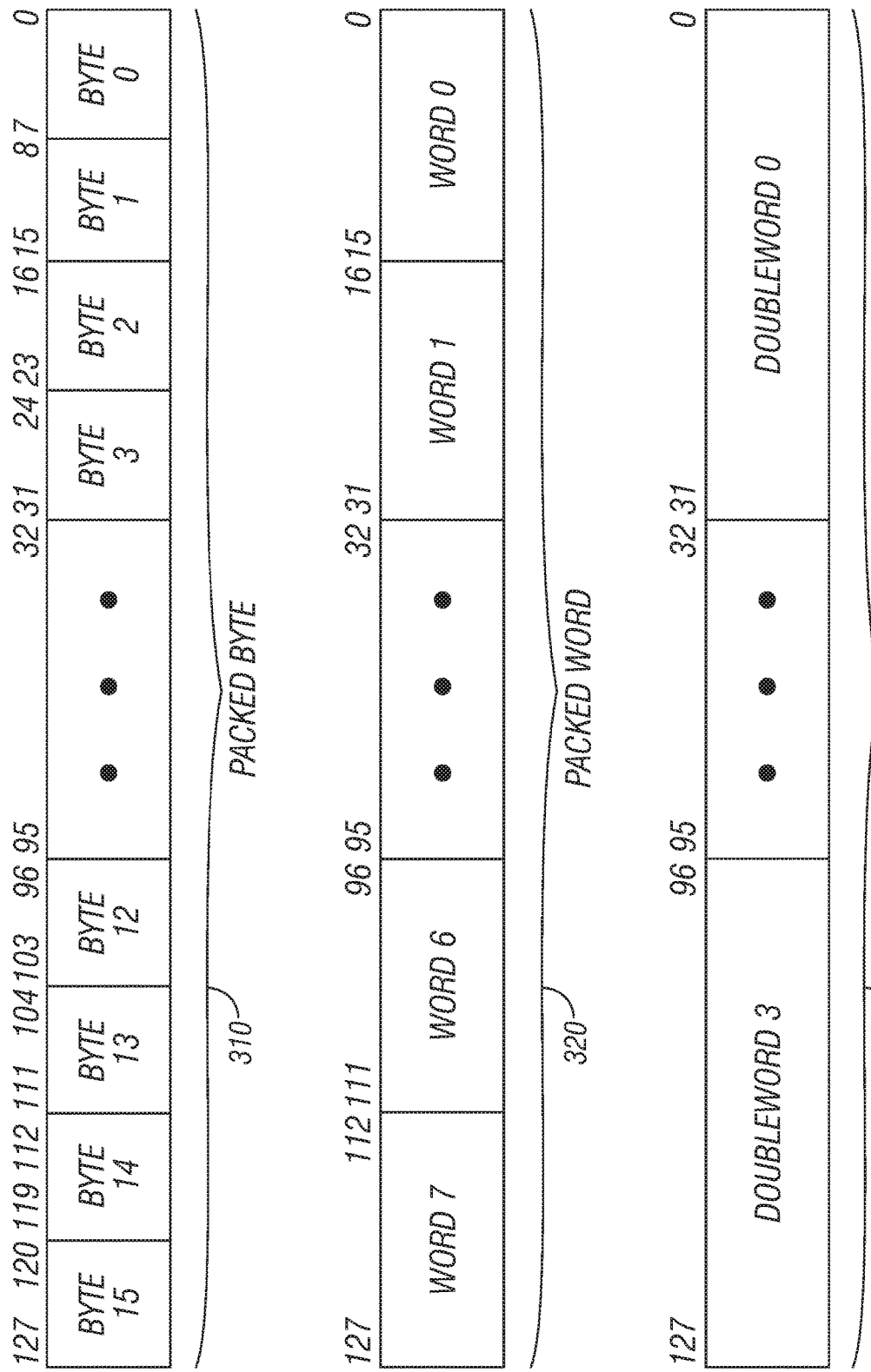
FIG. 3A illustrates various packed data type representations in multimedia registers, in accordance with embodiments of the present disclosure.

In the examples of the following figures, a number of data operands may be described. FIG. 3A illustrates various packed data type representations in multimedia registers, in accordance with embodiments of the present disclosure. FIG. 3A illustrates data types for a packed byte 310, a packed word 320, and a packed doubleword (dword) 330 for 128-bit wide operands. Packed byte format 310 of this example may be 128 bits long and contains sixteen packed byte data elements. A byte may be defined, for example, as eight bits of data. Information for each byte data element may be stored in bit 7 through bit 0 for byte 0, bit 15 through bit 8 for byte 1, bit 23 through bit 16 for byte 2, and finally bit 120 through bit 127 for byte 15. Thus, all available bits may be used in the register. This storage arrangement increases the storage efficiency of the processor. As well, with sixteen data elements accessed, one operation may now be performed on sixteen data elements in parallel.

Generally, a data element may include an individual piece of data that is stored in a single register or memory location with other data elements of the same length. In packed data sequences relating to SSEx technology, the number of data elements stored in a XMM register may be 128 bits divided by the length in bits of an individual data element. Similarly, in packed data sequences relating to MMX and SSE technology, the number of data elements stored in an MMX register may be 64 bits divided by the length in bits of an individual data element. Although the data types illustrated in FIG. 3A may be 128 bits long, embodiments of the present disclosure may also operate with 64-bit wide or other sized operands. Packed word format 320 of this example may be 128 bits long and contains eight packed word data elements. Each packed word contains sixteen bits of information. Packed doubleword format 330 of FIG. 3A may be 128 bits long and contains four packed doubleword data elements. Each packed doubleword data element contains thirty-two bits of information. A packed quadword may be 128 bits long and contain two packed quad-word data elements.

Figure 3B:
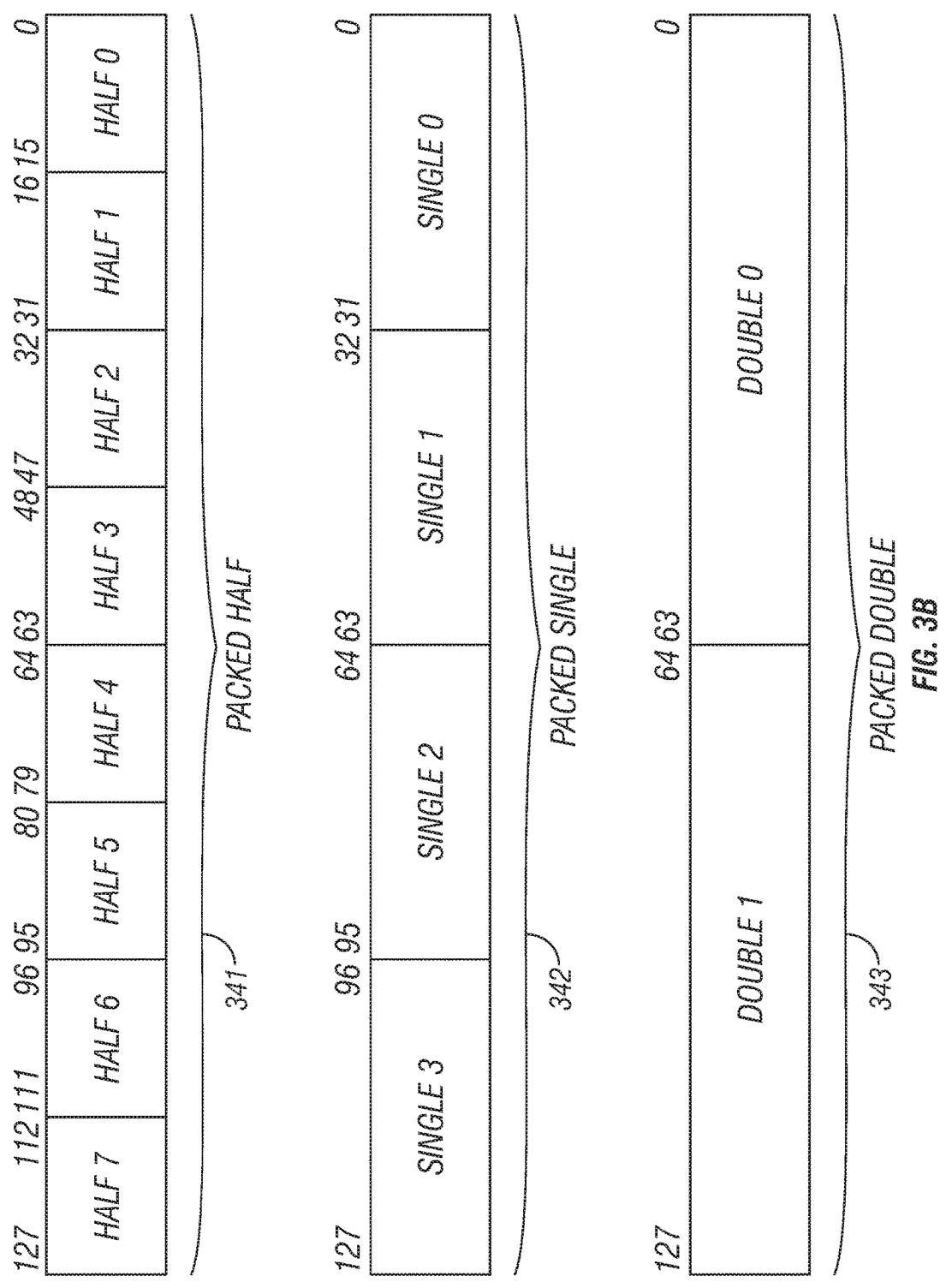

FIG. 3B illustrates possible in-register data storage formats, in accordance with embodiments of the present disclosure. Each packed data may include more than one independent data element. Three packed data formats are illustrated; packed half 341, packed single 342, and packed double 343. One embodiment of packed half 341, packed single 342, and packed double 343 contain fixed-point data elements. For another embodiment one or more of packed half 341, packed single 342, and packed double 343 may contain floating-point data elements. One embodiment of packed half 341 may be 128 bits long containing eight 16-bit data elements. One embodiment of packed single 342 may be 128 bits long and contains four 32-bit data elements. One embodiment of packed double 343 may be 128 bits long and contains two 64-bit data elements. It will be appreciated that such packed data formats may be further extended to other register lengths, for example, to 96-bits, 160-bits, 192-bits, 224-bits, 256-bits or more.

FIG. 3C illustrates various signed and unsigned packed data type representations in multimedia registers, in accordance with embodiments of the present disclosure. Unsigned packed byte representation 344 illustrates the storage of an unsigned packed byte in a SIMD register. Information for each byte data element may be stored in bit 7 through bit 0 for byte 0, bit 15 through bit 8 for byte 1, bit 23 through bit 16 for byte 2, and finally bit 120 through bit 127 for byte 15. Thus, all available bits may be used in the register. This storage arrangement may increase the storage efficiency of the processor. As well, with sixteen data elements accessed, one operation may now be performed on sixteen data elements in a parallel fashion. Signed packed byte representation 345 illustrates the storage of a signed packed byte. Note that the eighth bit of every byte data element may be the sign indicator. Unsigned packed word representation 346 illustrates how word seven through word zero may be stored in a SIMD register. Signed packed word representation 347 may be similar to the unsigned packed word in-register representation 346. Note that the sixteenth bit of each word data element may be the sign indicator. Unsigned packed doubleword representation 348 shows how doubleword data elements are stored. Signed packed doubleword representation 349 may be similar to unsigned packed doubleword in-register representation 348. Note that the necessary sign bit may be the thirty-second bit of each doubleword data element.

FIG. 3D illustrates an embodiment of an operation encoding (opcode). Furthermore, format 360 may include register/memory operand addressing modes corresponding with a type of opcode format described in the "IA-32 Intel Architecture Software Developer's Manual Volume 2: Instruction Set Reference," which is available from Intel Corporation, Santa Clara, Calif. on the world-wide-web (www) at intel-.com/design/litcentr. In one embodiment, and instruction may be encoded by one or more of fields 361 and 362. Up to two operand locations per instruction may be identified, including up to two source operand identifiers 364 and 365. In one embodiment, destination operand identifier 366 may be the same as source operand identifier 364, whereas in other embodiments they may be different. In another embodiment, destination operand identifier 366 may be the same as source operand identifier 365, whereas in other embodiments they may be different. In one embodiment, one of the source operands identified by source operand identifiers 364 and 365 may be overwritten by the results of the text string comparison operations, whereas in other embodiments identifier 364 corresponds to a source register element and identifier 365 corresponds to a destination register element. In one embodiment, operand identifiers 364 and 365 may identify 32-bit or 64-bit source and destination operands.

FIG. 3E illustrates another possible operation encoding (opcode) format 370, having forty or more bits, in accordance with embodiments of the present disclosure. Opcode format 370 corresponds with opcode format 360 and comprises an optional prefix byte 378. An instruction according to one embodiment may be encoded by one or more of fields 378, 371, and 372. Up to two operand locations per instruction may be identified by source operand identifiers 374 and 375 and by prefix byte 378. In one embodiment, prefix byte 378 may be used to identify 32-bit or 64-bit source and destination operands. In one embodiment, destination operand identifier 376 may be the same as source operand identifier 374, whereas in other embodiments they may be different. For another embodiment, destination operand identifier 376 may be the same as source operand identifier 375, whereas in other embodiments they may be different. In one embodiment, an instruction operates on one or more of the operands identified by operand identifiers 374 and 375 and one or more operands identified by operand identifiers 374 and 375 may be overwritten by the results of the instruction, whereas in other embodiments, operands identified by identifiers 374 and 375 may be written to another data element in another register. Opcode formats 360 and 370 allow register to register, memory to register, register by memory, register by register, register by immediate, register to memory addressing specified in part by MOD fields 363 and 373 and by optional scale-index-base and displacement bytes.

FIG. 3F illustrates yet another possible operation encoding (opcode) format, in accordance with embodiments of the present disclosure. 64-bit single instruction multiple data (SIMD) arithmetic operations may be performed through a coprocessor data processing (CDP) instruction. Operation encoding (opcode) format 380 depicts one such CDP instruction having CDP opcode fields 382-389. The type of CDP instruction, for another embodiment, operations may be encoded by one or more of fields 383, 384, 387, and 388. Up to three operand locations per instruction may be identified, including up to two source operand identifiers 385 and 390 and one destination operand identifier 386. One embodiment of the coprocessor may operate on eight, sixteen, thirty-two, and 64-bit values. In one embodiment, an instruction may be performed on integer data elements. In some embodiments, an instruction may be executed conditionally, using condition field 381. For some embodiments, source data sizes may be encoded by field 383. In some embodiments, Zero (Z), negative (N), carry (C), and overflow (V) detection may be done on SIMD fields. For some instructions, the type of saturation may be encoded by field 384.

Figure 4A:
FIG. 4A is a block diagram illustrating an in-order pipeline and a register renaming stage, out-of-order issue/execution pipeline, in accordance with embodiments of the present disclosure.
Figure 4B:
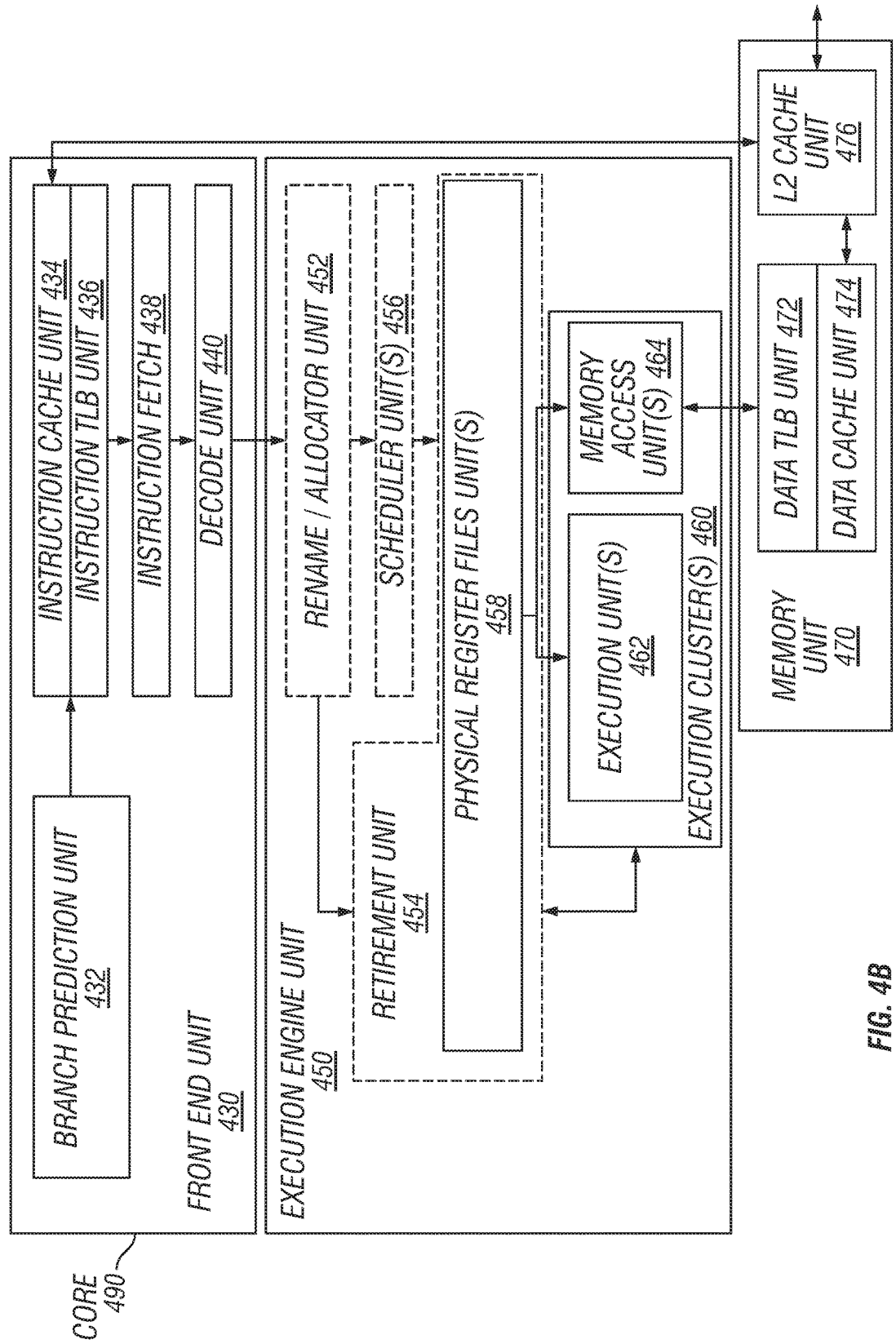
FIG. 4B is a block diagram illustrating an in-order architecture core and a register renaming logic, out-of-order issue/execution logic to be included in a processor, in accordance with embodiments of the present disclosure.

FIG. 4A is a block diagram illustrating an in-order pipeline and a register renaming stage, out-of-order issue/execution pipeline, in accordance with embodiments of the present disclosure. FIG. 4B is a block diagram illustrating an in-order architecture core and a register renaming logic, out-of-order issue/execution logic to be included in a processor, in accordance with embodiments of the present disclosure. The solid lined boxes in FIG. 4A illustrate the in-order pipeline, while the dashed lined boxes illustrates the register renaming, out-of-order issue/execution pipeline. Similarly, the solid lined boxes in FIG. 4B illustrate the in-order architecture logic, while the dashed lined boxes illustrates the register renaming logic and out-of-order issue/execution logic.

In FIG. 4A, a processor pipeline 400 may include a fetch stage 402, a length decode stage 404, a decode stage 406, an allocation stage 408, a renaming stage 410, a scheduling (also known as a dispatch or issue) stage 412, a register read/memory read stage 414, an execute stage 416, a write-back/memory-write stage 418, an exception handling stage 422, and a commit stage 424.

In FIG. 4B, arrows denote a coupling between two or more units and the direction of the arrow indicates a direction of data flow between those units. FIG. 4B shows processor core 490 including a front end unit 430 coupled to an execution engine unit 450, and both may be coupled to a memory unit 470.

Core 490 may be a reduced instruction set computing (RISC) core, a complex instruction set computing (CISC) core, a very long instruction word (VLIW) core, or a hybrid or alternative core type. In one embodiment, core 490 may be a special-purpose core, such as, for example, a network or communication core, compression engine, graphics core, or the like.

Front end unit 430 may include a branch prediction unit 432 coupled to an instruction cache unit 434. Instruction cache unit 434 may be coupled to an instruction translation lookaside buffer (TLB) 436. TLB 436 may be coupled to an instruction fetch unit 438, which is coupled to a decode unit 440. Decode unit 440 may decode instructions, and generate as an output one or more micro-operations, micro-code entry points, microinstructions, other instructions, or other control signals, which may be decoded from, or which otherwise reflect, or may be derived from, the original instructions. The decoder may be implemented using various different mechanisms. Examples of suitable mechanisms include, but are not limited to, look-up tables, hardware implementations, programmable logic arrays (PLAs), microcode read-only memories (ROMs), etc. In one embodiment, instruction cache unit 434 may be further coupled to a level 2 (L2) cache unit 476 in memory unit 470. Decode unit 440 may be coupled to a rename/allocator unit 452 in execution engine unit 450.

Execution engine unit 450 may include rename/allocator unit 452 coupled to a retirement unit 454 and a set of one or more scheduler units 456. Scheduler units 456 represent any number of different schedulers, including reservations stations, central instruction window, etc. Scheduler units 456 may be coupled to physical register file units 458. Each of physical register file units 458 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. Physical register file units 458 may be overlapped by retirement unit 154 to illustrate various ways in which register renaming and out-of-order execution may be implemented (e.g., using one or more reorder buffers and one or more retirement register files, using one or more future files, one or more history buffers, and one or more retirement register files; using register maps and a pool of registers; etc.). Generally, the architectural registers may be visible from the outside of the processor or from a programmer's perspective. The registers might not be limited to any known particular type of circuit. Various different types of registers may be suitable as long as they store and provide data as described herein. Examples of suitable registers include, but might not be limited to, dedicated physical registers, dynamically allocated physical registers using register renaming, combinations of dedicated and dynamically allocated physical registers, etc. Retirement unit 454 and physical register file units 458 may be coupled to execution clusters 460. Execution clusters 460 may include a set of one or more execution units 162 and a set of one or more memory access units 464. Execution units 462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. Scheduler units 456, physical register file units 458, and execution clusters 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file unit, and/or execution cluster—and in the case of a separate memory access pipeline, certain embodiments may be implemented in which only the execution cluster of this pipeline has memory access units 464). It should also be understood that where separate pipelines are used, one or more of these pipelines may be out-of-order issue/execution and the rest in-order.

The set of memory access units 464 may be coupled to memory unit 470, which may include a data TLB unit 472 coupled to a data cache unit 474 coupled to a level 2 (L2) cache unit 476. In one exemplary embodiment, memory access units 464 may include a load unit, a store address unit, and a store data unit, each of which may be coupled to data TLB unit 472 in memory unit 470. L2 cache unit 476 may be coupled to one or more other levels of cache and eventually to a main memory.

By way of example, the exemplary register renaming, out-of-order issue/execution core architecture may implement pipeline 400 as follows: 1) instruction fetch 438 may perform fetch and length decoding stages 402 and 404; 2) decode unit 440 may perform decode stage 406; 3) rename/allocator unit 452 may perform allocation stage 408 and renaming stage 410; 4) scheduler units 456 may perform schedule stage 412; 5) physical register file units 458 and memory unit 470 may perform register read/memory read stage 414; execution cluster 460 may perform execute stage 416; 6) memory unit 470 and physical register file units 458 may perform write-back/memory-write stage 418; 7) various units may be involved in the performance of exception handling stage 422; and 8) retirement unit 454 and physical register file units 458 may perform commit stage 424.

Core 490 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multi-threading (executing two or more parallel sets of operations or threads) in a variety of manners. Multithreading support may be performed by, for example, including time sliced multithreading, simultaneous multithreading (where a single physical core provides a logical core for each of the threads that physical core is simultaneously multithreading), or a combination thereof. Such a combination may include, for example, time sliced fetching and decoding and simultaneous multithreading thereafter such as in the Intel® Hyperthreading technology.

While register renaming may be described in the context of out-of-order execution, it should be understood that register renaming may be used in an in-order architecture. While the illustrated embodiment of the processor may also include a separate instruction and data cache units 434/474 and a shared L2 cache unit 476, other embodiments may have a single internal cache for both instructions and data, such as, for example, a Level 1 (L1) internal cache, or multiple levels of internal cache. In some embodiments, the system may include a combination of an internal cache and an external cache that may be external to the core and/or the processor. In other embodiments, all of the cache may be external to the core and/or the processor.

Figure 5A:
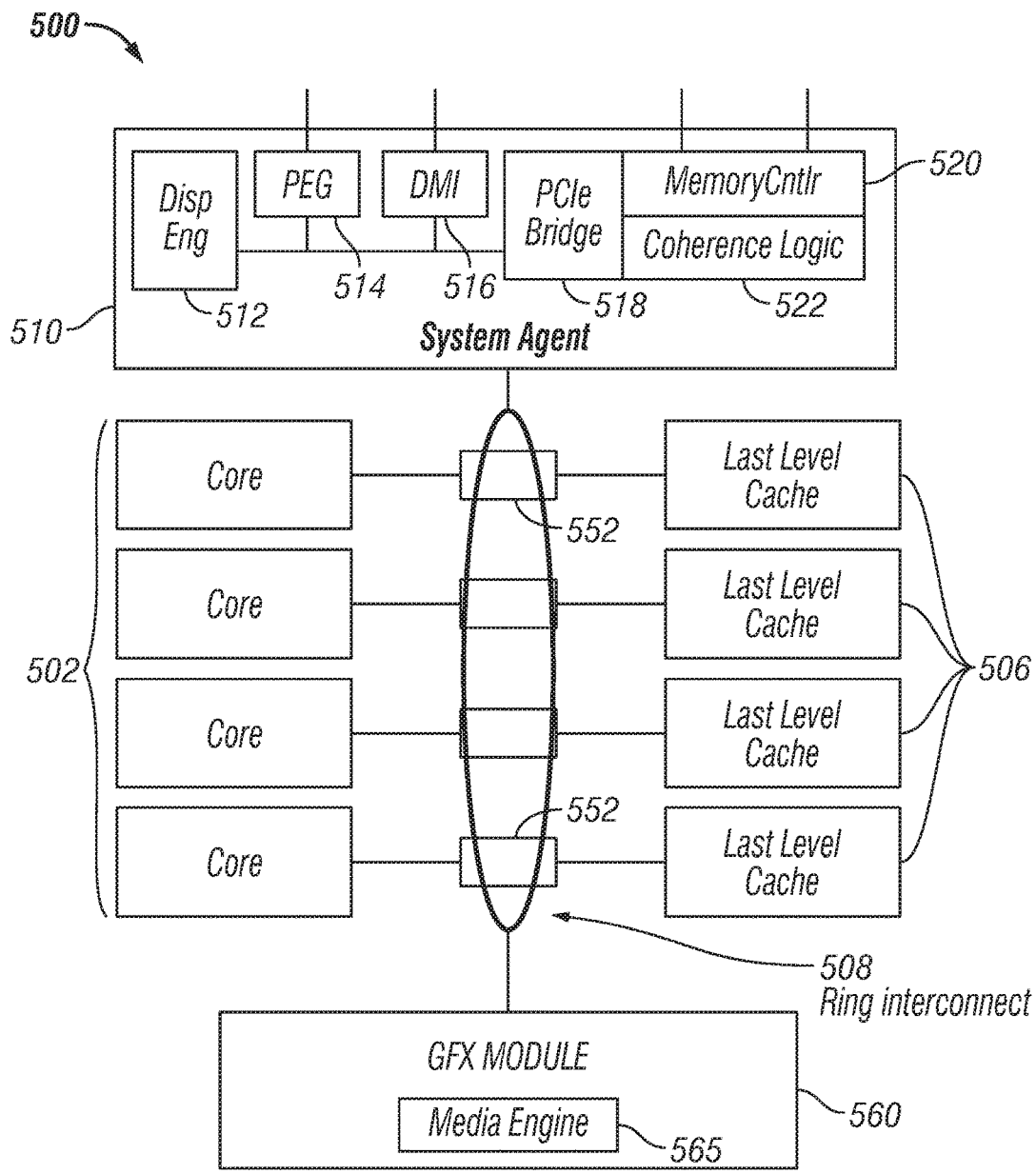
FIG. 5A is a block diagram of a processor, in accordance with embodiments of the present disclosure.

FIG. 5A is a block diagram of a processor 500, in accordance with embodiments of the present disclosure. In one embodiment, processor 500 may include a multicore processor. Processor 500 may include a system agent 510 communicatively coupled to one or more cores 502. Furthermore, cores 502 and system agent 510 may be communicatively coupled to one or more caches 506. Cores 502, system agent 510, and caches 506 may be communicatively coupled via one or more memory control units 552. Furthermore, cores 502, system agent 510, and caches 506 may be communicatively coupled to a graphics module 560 via memory control units 552.

Processor 500 may include any suitable mechanism for interconnecting cores 502, system agent 510, and caches 506, and graphics module 560. In one embodiment, processor 500 may include a ring-based interconnect unit 508 to interconnect cores 502, system agent 510, and caches 506, and graphics module 560. In other embodiments, processor 500 may include any number of well-known techniques for interconnecting such units. Ring-based interconnect unit 508 may utilize memory control units 552 to facilitate interconnections.

Processor 500 may include a memory hierarchy comprising one or more levels of caches within the cores, one or more shared cache units such as caches 506, or external memory (not shown) coupled to the set of integrated memory controller units 552. Caches 506 may include any suitable cache. In one embodiment, caches 506 may include one or more mid-level caches, such as level 2 (L2), level 3 (L3), level 4 (L4), or other levels of cache, a last level cache (LLC), and/or combinations thereof.

In various embodiments, one or more of cores 502 may perform multi-threading. System agent 510 may include components for coordinating and operating cores 502. System agent unit 510 may include for example a power control unit (PCU). The PCU may be or include logic and components needed for regulating the power state of cores 502. System agent 510 may include a display engine 512 for driving one or more externally connected displays or graphics module 560. System agent 510 may include an interface 1214 for communications busses for graphics. In one embodiment, interface 1214 may be implemented by PCI Express (PCIe). In a further embodiment, interface 1214 may be implemented by PCI Express Graphics (PEG). System agent 510 may include a direct media interface (DMI) 516. DMI 516 may provide links between different bridges on a motherboard or other portion of a computer system. System agent 510 may include a PCIe bridge 1218 for providing PCIe links to other elements of a computing system. PCIe bridge 1218 may be implemented using a memory controller 1220 and coherence logic 1222.

Cores 502 may be implemented in any suitable manner. Cores 502 may be homogenous or heterogeneous in terms of architecture and/or instruction set. In one embodiment, some of cores 502 may be in-order while others may be out-of-order. In another embodiment, two or more of cores 502 may execute the same instruction set, while others may execute only a subset of that instruction set or a different instruction set.

Processor 500 may include a general-purpose processor, such as a Core™ i3, i5, i7, 2 Duo and Quad, Xeon™, Itanium™, XScale™ or StrongARM™ processor, which may be available from Intel Corporation, of Santa Clara, Calif. Processor 500 may be provided from another company, such as ARM Holdings, Ltd, MIPS, etc. Processor 500 may be a special-purpose processor, such as, for example, a network or communication processor, compression engine, graphics processor, co-processor, embedded processor, or the like. Processor 500 may be implemented on one or more chips. Processor 500 may be a part of and/or may be implemented on one or more substrates using any of a number of process technologies, such as, for example, BiCMOS, CMOS, or NMOS.

In one embodiment, a given one of caches 506 may be shared by multiple ones of cores 502. In another embodiment, a given one of caches 506 may be dedicated to one of cores 502. The assignment of caches 506 to cores 502 may be handled by a cache controller or other suitable mechanism. A given one of caches 506 may be shared by two or more cores 502 by implementing time-slices of a given cache 506.

Graphics module 560 may implement an integrated graphics processing subsystem. In one embodiment, graphics module 560 may include a graphics processor. Furthermore, graphics module 560 may include a media engine 565. Media engine 565 may provide media encoding and video decoding.

Figure 5B:
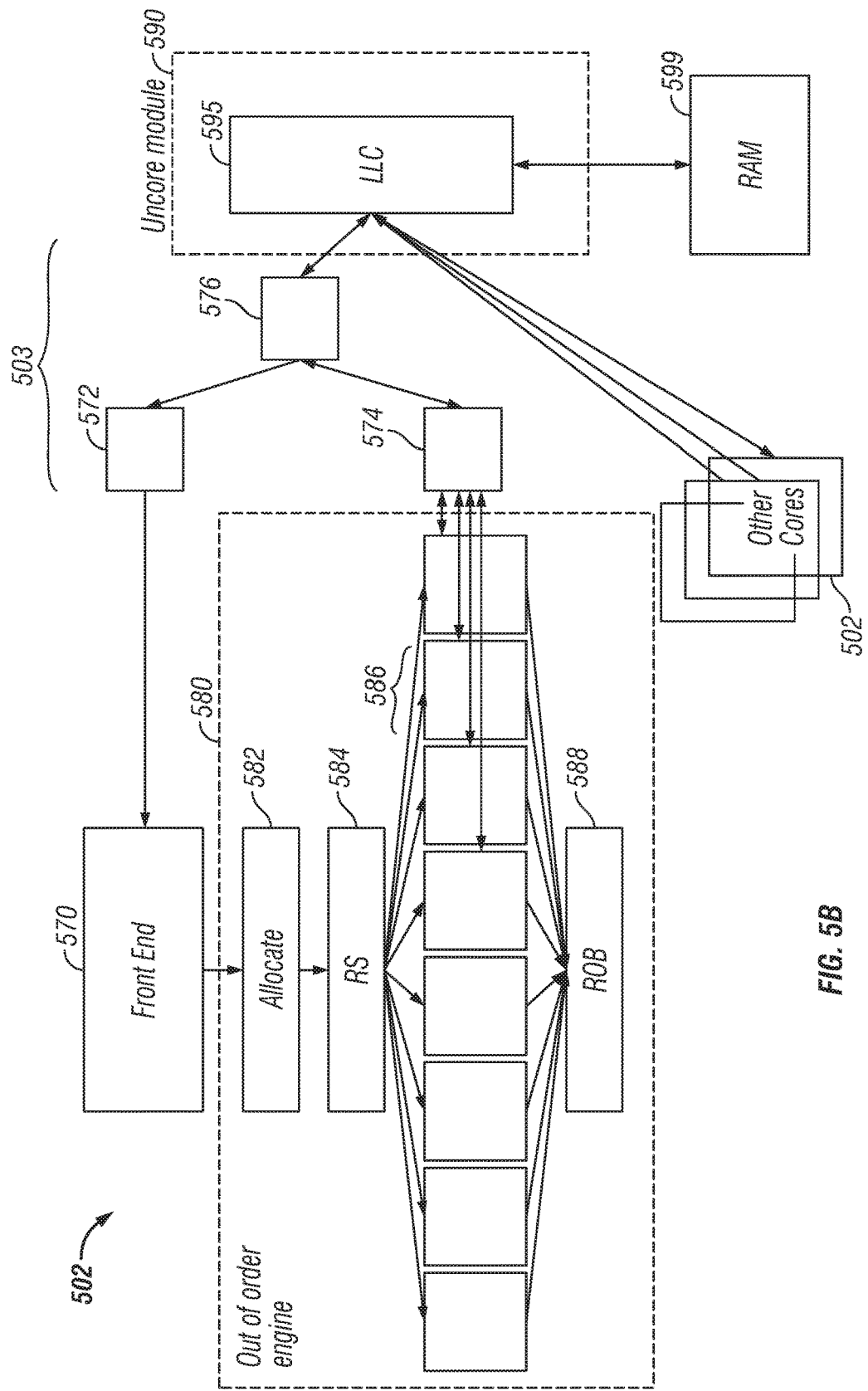
FIG. 5B is a block diagram of an example implementation of a core, in accordance with embodiments of the present disclosure.

FIG. 5B is a block diagram of an example implementation of a core 502, in accordance with embodiments of the present disclosure. Core 502 may include a front end 570 communicatively coupled to an out-of-order engine 580. Core 502 may be communicatively coupled to other portions of processor 500 through cache hierarchy 503.

Front end 570 may be implemented in any suitable manner, such as fully or in part by front end 201 as described above. In one embodiment, front end 570 may communicate with other portions of processor 500 through cache hierarchy 503. In a further embodiment, front end 570 may fetch instructions from portions of processor 500 and prepare the instructions to be used later in the processor pipeline as they are passed to out-of-order execution engine 580.

Out-of-order execution engine 580 may be implemented in any suitable manner, such as fully or in part by out-of-order execution engine 203 as described above. Out-of-order execution engine 580 may prepare instructions received from front end 570 for execution. Out-of-order execution engine 580 may include an allocate module 1282. In one embodiment, allocate module 1282 may allocate resources of processor 500 or other resources, such as registers or buffers, to execute a given instruction. Allocate module 1282 may make allocations in schedulers, such as a memory scheduler, fast scheduler, or floating point scheduler. Such schedulers may be represented in FIG. 5B by resource schedulers 584. Allocate module 12182 may be implemented fully or in part by the allocation logic described in conjunction with FIG. 2. Resource schedulers 584 may determine when an instruction is ready to execute based on the readiness of a given resource's sources and the availability of execution resources needed to execute an instruction. Resource schedulers 584 may be implemented by, for example, schedulers 202, 204, 206 as discussed above. Resource schedulers 584 may schedule the execution of instructions upon one or more resources. In one embodiment, such resources may be internal to core 502, and may be illustrated, for example, as resources 586. In another embodiment, such resources may be external to core 502 and may be accessible by, for example, cache hierarchy 503. Resources may include, for example, memory, caches, register files, or registers. Resources internal to core 502 may be represented by resources 586 in FIG. 5B. As necessary, values written to or read from resources 586 may be coordinated with other portions of processor 500 through, for example, cache hierarchy 503. As instructions are assigned resources, they may be placed into a reorder buffer 588. Reorder buffer 588 may track instructions as they are executed and may selectively reorder their execution based upon any suitable criteria of processor 500. In one embodiment, reorder buffer 588 may identify instructions or a series of instructions that may be executed independently. Such instructions or a series of instructions may be executed in parallel from other such instructions. Parallel execution in core 502 may be performed by any suitable number of separate execution blocks or virtual processors. In one embodiment, shared resources—such as memory, registers, and caches—may be accessible to multiple virtual processors within a given core 502. In other embodiments, shared resources may be accessible to multiple processing entities within processor 500.

Cache hierarchy 503 may be implemented in any suitable manner. For example, cache hierarchy 503 may include one or more lower or mid-level caches, such as caches 572, 574. In one embodiment, cache hierarchy 503 may include an LLC 595 communicatively coupled to caches 572, 574. In another embodiment, LLC 595 may be implemented in a module 590 accessible to all processing entities of processor 500. In a further embodiment, module 590 may be implemented in an uncore module of processors from Intel, Inc. Module 590 may include portions or subsystems of processor 500 necessary for the execution of core 502 but might not be implemented within core 502. Besides LLC 595, Module 590 may include, for example, hardware interfaces, memory coherency coordinators, interprocessor interconnects, instruction pipelines, or memory controllers. Access to RAM 599 available to processor 500 may be made through module 590 and, more specifically, LLC 595. Furthermore, other instances of core 502 may similarly access module 590. Coordination of the instances of core 502 may be facilitated in part through module 590.

Figure 6:
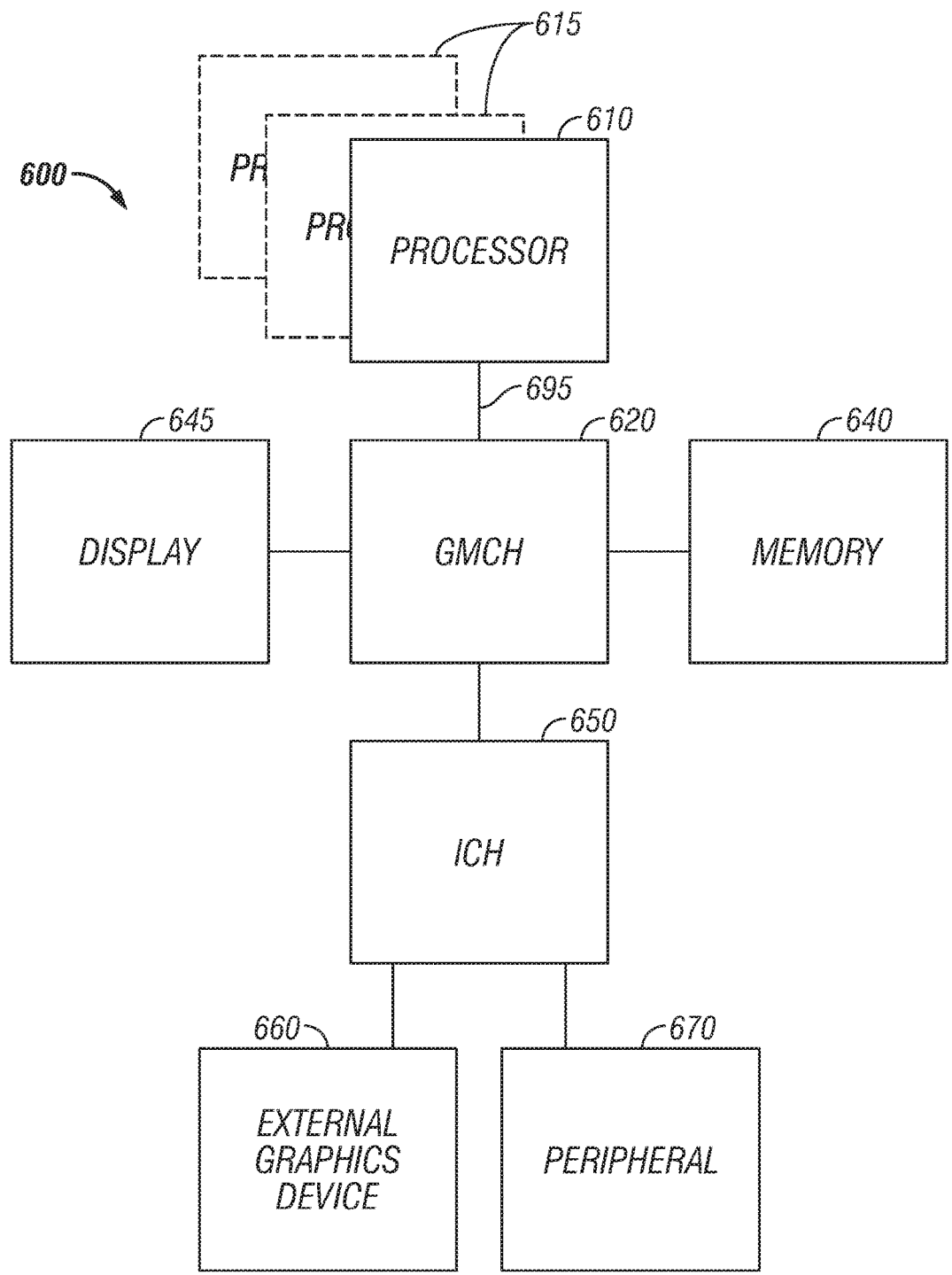
FIG. 6 is a block diagram of a system, in accordance with embodiments of the present disclosure.
Figure 7:
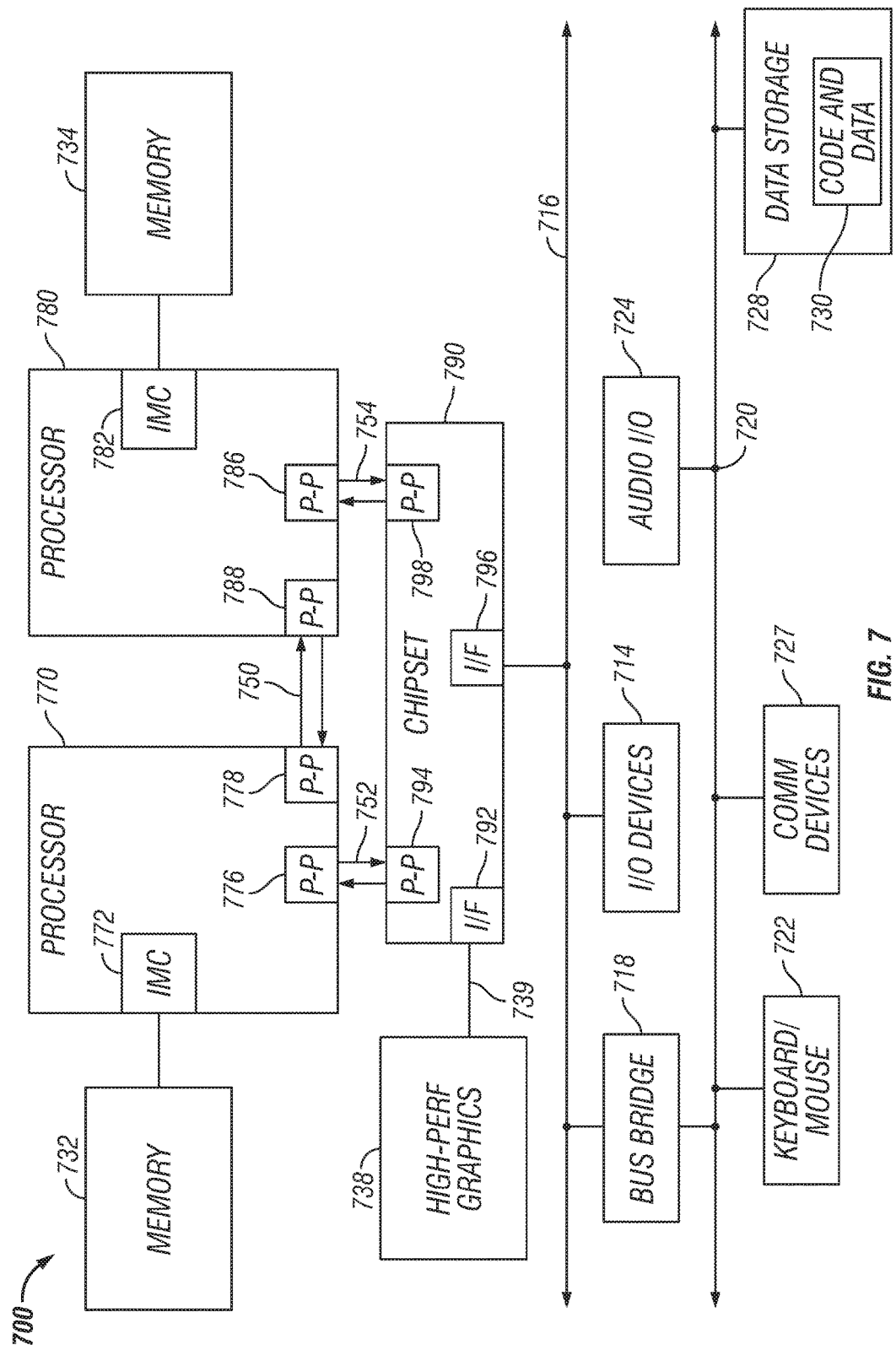
FIG. 7 is a block diagram of a second system, in accordance with embodiments of the present disclosure.
Figure 8:
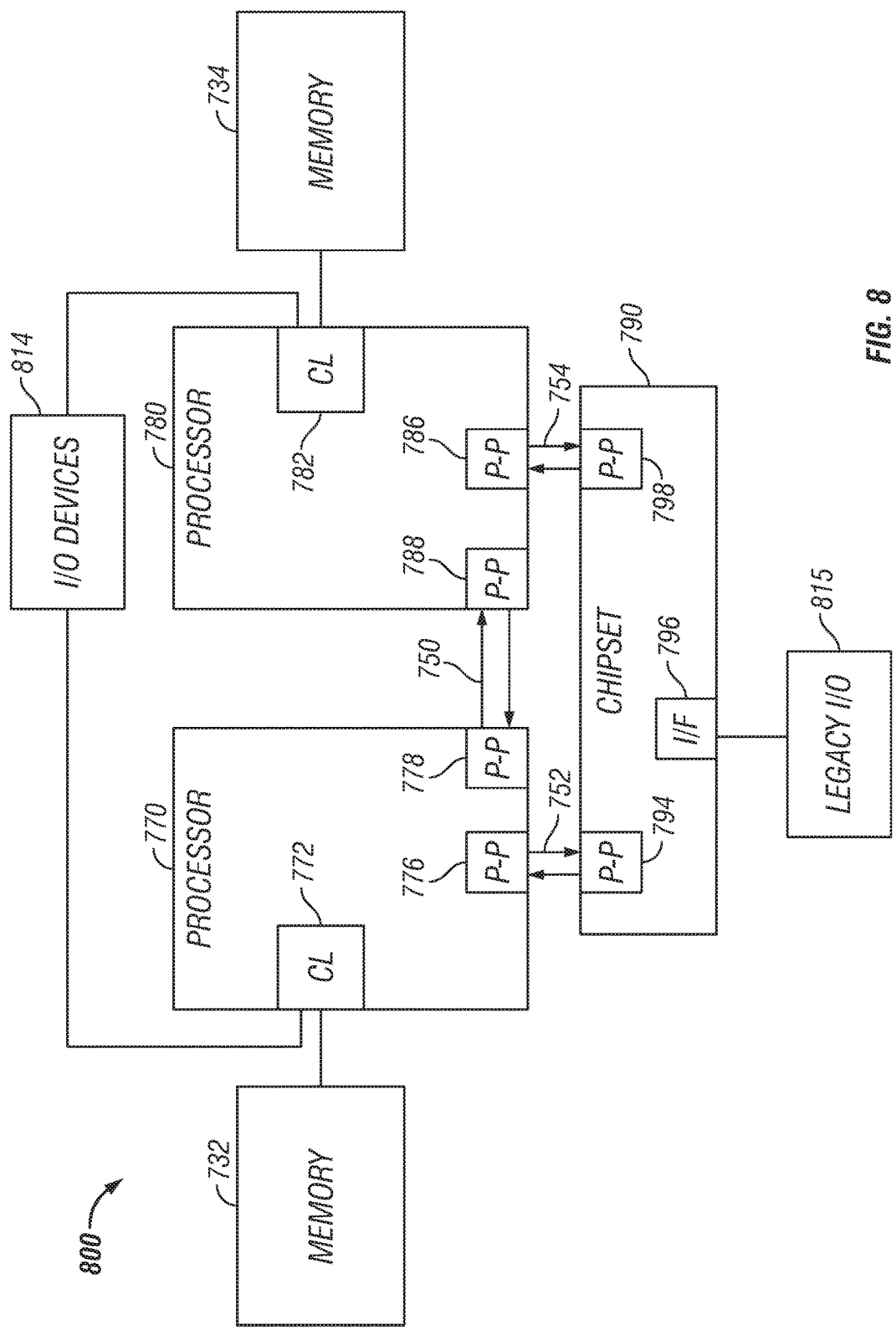
FIG. 8 is a block diagram of a third system in accordance with embodiments of the present disclosure.
Figure 9:
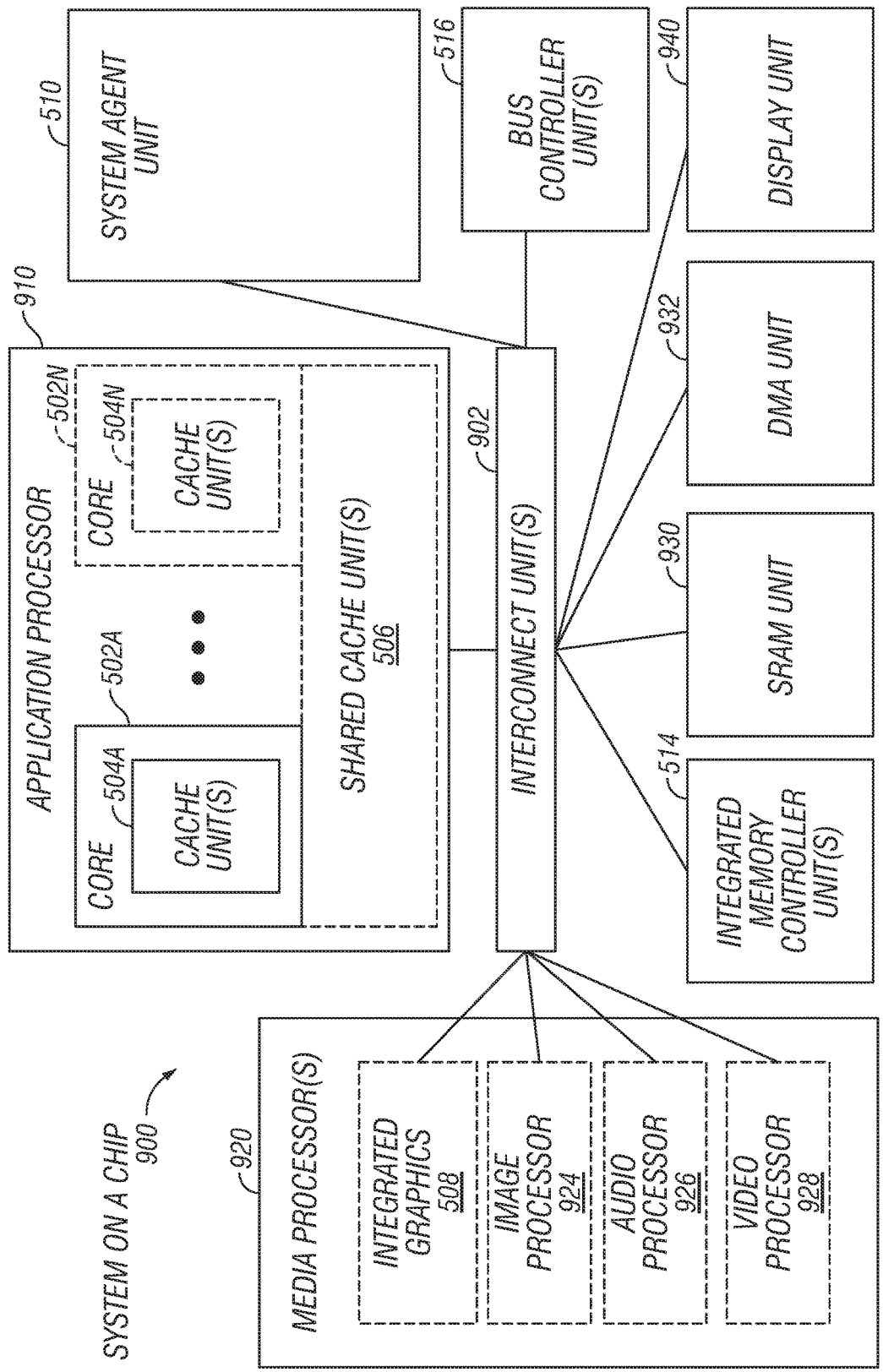
FIG. 9 is a block diagram of a system-on-a-chip, in accordance with embodiments of the present disclosure.

FIGS. 6-8 may illustrate exemplary systems suitable for including processor 500, while FIG. 9 may illustrate an exemplary system on a chip (SoC) that may include one or more of cores 502. Other system designs and implementations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, may also be suitable. In general, a huge variety of systems or electronic devices that incorporate a processor and/or other execution logic as disclosed herein may be generally suitable.

FIG. 6 illustrates a block diagram of a system 600, in accordance with embodiments of the present disclosure. System 600 may include one or more processors 610, 615, which may be coupled to graphics memory controller hub (GMCH) 620. The optional nature of additional processors 615 is denoted in FIG. 6 with broken lines.

Each processor 610,615 may be some version of processor 500. However, it should be noted that integrated graphics logic and integrated memory control units might not exist in processors 610,615. FIG. 6 illustrates that GMCH 620 may be coupled to a memory 640 that may be, for example, a dynamic random access memory (DRAM). The DRAM may, for at least one embodiment, be associated with a non-volatile cache.

GMCH 620 may be a chipset, or a portion of a chipset. GMCH 620 may communicate with processors 610, 615 and control interaction between processors 610, 615 and memory 640. GMCH 620 may also act as an accelerated bus interface between the processors 610, 615 and other elements of system 600. In one embodiment, GMCH 620 communicates with processors 610, 615 via a multi-drop bus, such as a frontside bus (FSB) 695.

Furthermore, GMCH 620 may be coupled to a display 645 (such as a flat panel display). In one embodiment, GMCH 620 may include an integrated graphics accelerator. GMCH 620 may be further coupled to an input/output (I/O) controller hub (ICH) 650, which may be used to couple various peripheral devices to system 600. External graphics device 660 may include be a discrete graphics device coupled to ICH 650 along with another peripheral device 670.

In other embodiments, additional or different processors may also be present in system 600. For example, additional processors 610, 615 may include additional processors that may be the same as processor 610, additional processors that may be heterogeneous or asymmetric to processor 610, accelerators (such as, e.g., graphics accelerators or digital signal processing (DSP) units), field programmable gate arrays, or any other processor. There may be a variety of differences between the physical resources 610, 615 in terms of a spectrum of metrics of merit including architectural, micro-architectural, thermal, power consumption characteristics, and the like. These differences may effectively manifest themselves as asymmetry and heterogeneity amongst processors 610, 615. For at least one embodiment, various processors 610, 615 may reside in the same die package.

FIG. 7 illustrates a block diagram of a second system 700, in accordance with embodiments of the present disclosure. As shown in FIG. 7, multiprocessor system 700 may include a point-to-point interconnect system, and may include a first processor 770 and a second processor 780 coupled via a point-to-point interconnect 750. Each of processors 770 and 780 may be some version of processor 500 as one or more of processors 610, 615.

While FIG. 7 may illustrate two processors 770, 780, it is to be understood that the scope of the present disclosure is not so limited. In other embodiments, one or more additional processors may be present in a given processor.

Processors 770 and 780 are shown including integrated memory controller units 772 and 782, respectively. Processor 770 may also include as part of its bus controller units point-to-point (P-P) interfaces 776 and 778; similarly, second processor 780 may include P-P interfaces 786 and 788. Processors 770, 780 may exchange information via a point-to-point (P-P) interface 750 using P-P interface circuits 778, 788. As shown in FIG. 7, IMCs 772 and 782 may couple the processors to respective memories, namely a memory 732 and a memory 734, which in one embodiment may be portions of main memory locally attached to the respective processors.

Processors 770, 780 may each exchange information with a chipset 790 via individual P-P interfaces 752, 754 using point to point interface circuits 776, 794, 786, 798. In one embodiment, chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present disclosure is not so limited.

As shown in FIG. 7, various I/O devices 714 may be coupled to first bus 716, along with a bus bridge 718 which couples first bus 716 to a second bus 720. In one embodiment, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720. Note that other architectures may be possible. For example, instead of the point-to-point architecture of FIG. 7, a system may implement a multi-drop bus or other such architecture.

FIG. 8 illustrates a block diagram of a third system 800 in accordance with embodiments of the present disclosure. Like elements in FIGS. 7 and 8 bear like reference numerals, and certain aspects of FIG. 7 have been omitted from FIG. 8 in order to avoid obscuring other aspects of FIG. 8.

FIG. 8 illustrates that processors 870, 880 may include integrated memory and I/O control logic ("CL") 872 and 882, respectively. For at least one embodiment, CL 872, 882 may include integrated memory controller units such as that described above in connection with FIGS. 5 and 7. In addition. CL 872, 882 may also include I/O control logic. FIG. 8 illustrates that not only memories 832, 834 may be coupled to CL 872, 882, but also that I/O devices 814 may also be coupled to control logic 872, 882. Legacy I/O devices 815 may be coupled to chipset 890.

FIG. 9 illustrates a block diagram of a SoC 900, in accordance with embodiments of the present disclosure. Similar elements in FIG. 5 bear like reference numerals. Also, dashed lined boxes may represent optional features on more advanced SoCs. An interconnect units 902 may be coupled to: an application processor 910 which may include a set of one or more cores 902A-N and shared cache units 906; a system agent unit 910; a bus controller units 916; an integrated memory controller units 914; a set or one or more media processors 920 which may include integrated graphics logic 908, an image processor 924 for providing still and/or video camera functionality, an audio processor 926 for providing hardware audio acceleration, and a video processor 928 for providing video encode/decode acceleration; an static random access memory (SRAM) unit 930; a direct memory access (DMA) unit 932; and a display unit 940 for coupling to one or more external displays.

Figure 10:
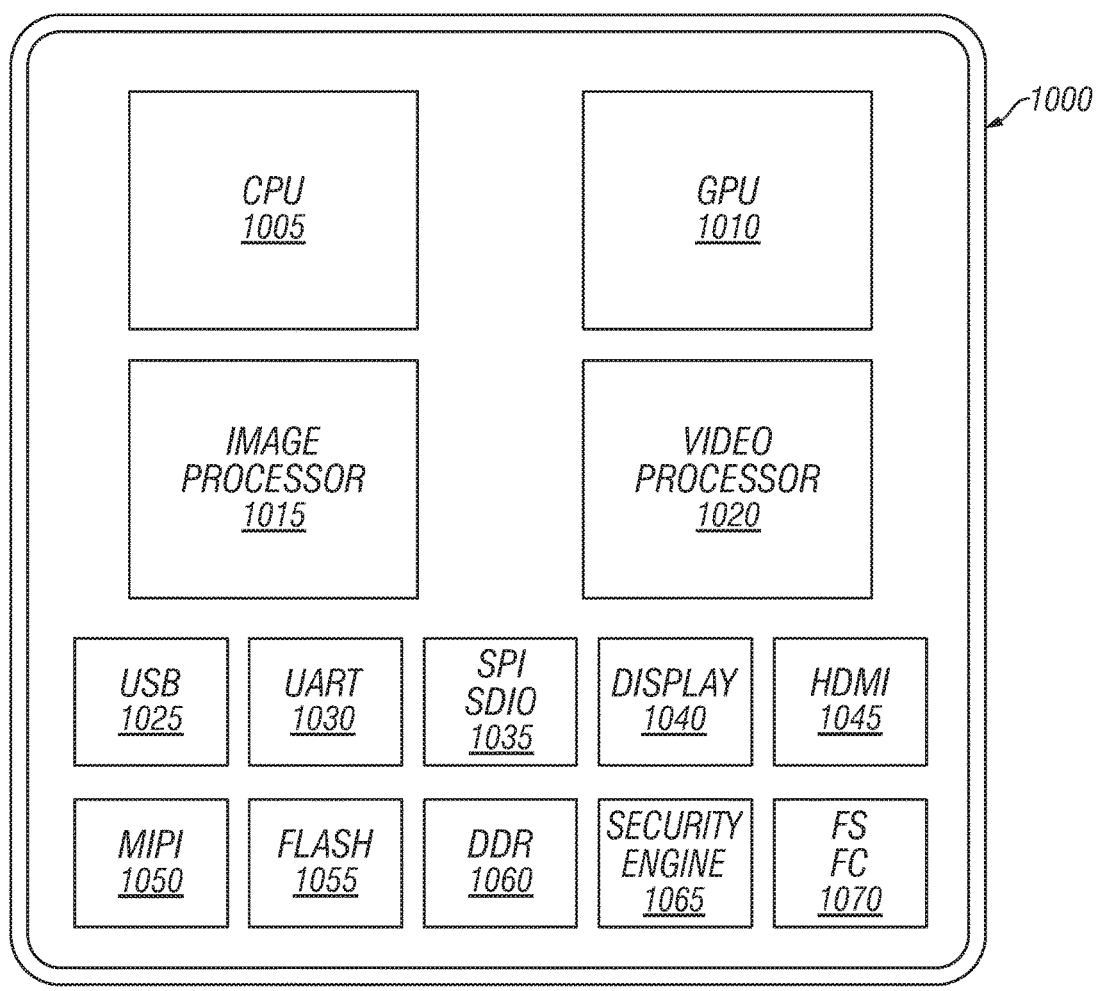
FIG. 10 illustrates a processor containing a central processing unit and a graphics processing unit which may perform at least one instruction, in accordance with embodiments of the present disclosure.

FIG. 10 illustrates a processor containing a central processing unit (CPU) and a graphics processing unit (GPU), which may perform at least one instruction, in accordance with embodiments of the present disclosure. In one embodiment, an instruction to perform operations according to at least one embodiment could be performed by the CPU. In another embodiment, the instruction could be performed by the GPU. In still another embodiment, the instruction may be performed through a combination of operations performed by the GPU and the CPU. For example, in one embodiment, an instruction in accordance with one embodiment may be received and decoded for execution on the GPU. However, one or more operations within the decoded instruction may be performed by a CPU and the result returned to the GPU for final retirement of the instruction. Conversely, in some embodiments, the CPU may act as the primary processor and the GPU as the co-processor.

In some embodiments, instructions that benefit from highly parallel, throughput processors may be performed by the GPU, while instructions that benefit from the performance of processors that benefit from deeply pipelined architectures may be performed by the CPU. For example, graphics, scientific applications, financial applications and other parallel workloads may benefit from the performance of the GPU and be executed accordingly, whereas more sequential applications, such as operating system kernel or application code may be better suited for the CPU.

In FIG. 10, processor 1000 includes a CPU 1005, GPU 1010, image processor 1015, video processor 1020, USB controller 1025, UART controller 1030, SPI/SDIO controller 1035, display device 1040, memory interface controller 1045, MIPI controller 1050, flash memory controller 1055, dual data rate (DDR) controller 1060, security engine 1065, and $I^2S/I^2C$ controller 1070. Other logic and circuits may be included in the processor of FIG. 10, including more CPUs or GPUs and other peripheral interface controllers.

One or more aspects of at least one embodiment may be implemented by representative data stored on a machine-readable medium which represents various logic within the processor, which when read by a machine causes the machine to fabricate logic to perform the techniques described herein. Such representations, known as "IP cores" may be stored on a tangible, machine-readable medium ("tape") and supplied to various customers or manufacturing facilities to load into the fabrication machines that actually make the logic or processor. For example, IP cores, such as the Cortex™ family of processors developed by ARM Holdings, Ltd. and Loongson IP cores developed the Institute of Computing Technology (ICT) of the Chinese Academy of Sciences may be licensed or sold to various customers or licensees, such as Texas Instruments, Qualcomm, Apple, or Samsung and implemented in processors produced by these customers or licensees.

Figure 11:
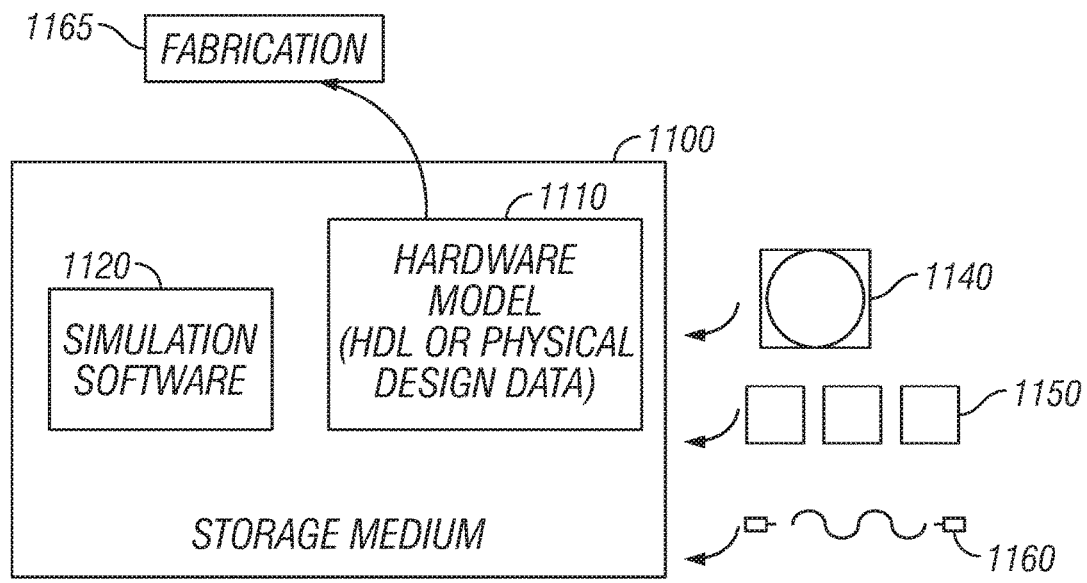
FIG. 11 is a block diagram illustrating the development of IP cores, in accordance with embodiments of the present disclosure.

FIG. 11 illustrates a block diagram illustrating the development of IP cores, in accordance with embodiments of the present disclosure. Storage 1130 may include simulation software 1120 and/or hardware or software model 1110. In one embodiment, the data representing the IP core design may be provided to storage 1130 via memory 1140 (e.g., hard disk), wired connection (e.g., internet) 1150 or wireless connection 1160. The IP core information generated by the simulation tool and model may then be transmitted to a fabrication facility where it may be fabricated by a 3$^{rd}$ party to perform at least one instruction in accordance with at least one embodiment.

In some embodiments, one or more instructions may correspond to a first type or architecture (e.g., x86) and be translated or emulated on a processor of a different type or architecture (e.g., ARM). An instruction, according to one embodiment, may therefore be performed on any processor or processor type, including ARM, x86, MIPS, a GPU, or other processor type or architecture.

Figure 12:
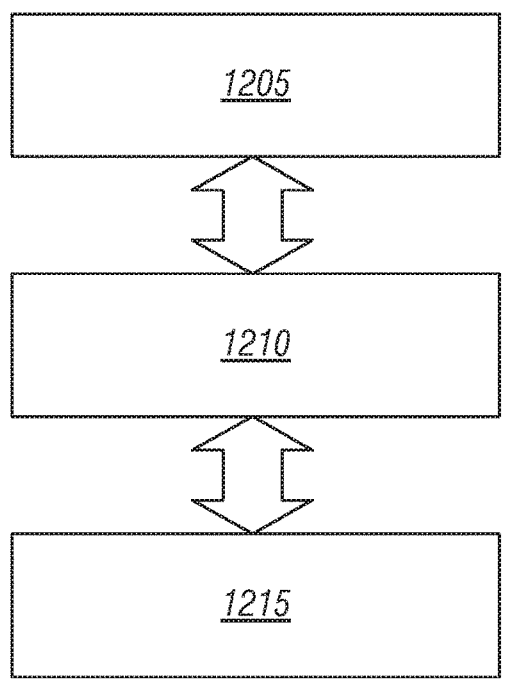
FIG. 12 illustrates how an instruction of a first type may be emulated by a processor of a different type, in accordance with embodiments of the present disclosure.

FIG. 12 illustrates how an instruction of a first type may be emulated by a processor of a different type, in accordance with embodiments of the present disclosure. In FIG. 12, program 1205 contains some instructions that may perform the same or substantially the same function as an instruction according to one embodiment. However the instructions of program 1205 may be of a type and/or format that is different from or incompatible with processor 1215, meaning the instructions of the type in program 1205 may not be able to execute natively by the processor 1215. However, with the help of emulation logic, 1210, the instructions of program 1205 may be translated into instructions that may be natively be executed by the processor 1215. In one embodiment, the emulation logic may be embodied in hardware. In another embodiment, the emulation logic may be embodied in a tangible, machine-readable medium containing software to translate instructions of the type in program 1205 into the type natively executable by processor 1215. In other embodiments, emulation logic may be a combination of fixed-function or programmable hardware and a program stored on a tangible, machine-readable medium. In one embodiment, the processor contains the emulation logic, whereas in other embodiments, the emulation logic exists outside of the processor and may be provided by a third party. In one embodiment, the processor may load the emulation logic embodied in a tangible, machine-readable medium containing software by executing microcode or firmware contained in or associated with the processor.

Figure 13:
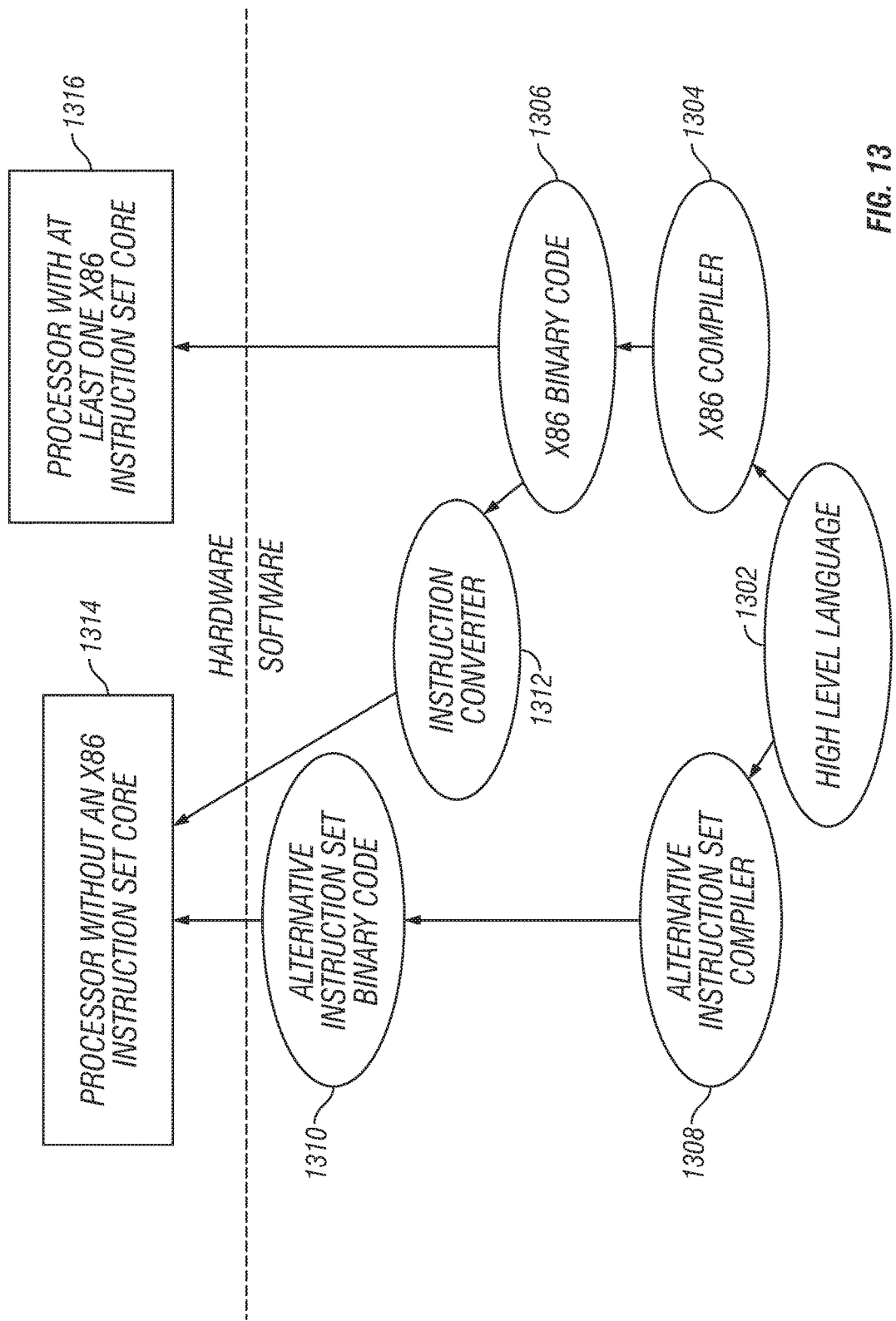
FIG. 13 illustrates a block diagram contrasting the use of a software instruction converter to convert binary instructions in a source instruction set to binary instructions in a target instruction set, in accordance with embodiments of the present disclosure.

FIG. 13 illustrates a block diagram contrasting the use of a software instruction converter to convert binary instructions in a source instruction set to binary instructions in a target instruction set, in accordance with embodiments of the present disclosure. In the illustrated embodiment, the instruction converter may be a software instruction converter, although the instruction converter may be implemented in software, firmware, hardware, or various combinations thereof. FIG. 13 shows a program in a high level language 1302 may be compiled using an x86 compiler 1304 to generate x86 binary code 1306 that may be natively executed by a processor with at least one x86 instruction set core 1316. The processor with at least one x86 instruction set core 1316 represents any processor that may perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. x86 compiler 1304 represents a compiler that may be operable to generate x86 binary code 1306 (e.g., object code) that may, with or without additional linkage processing, be executed on the processor with at least one x86 instruction set core 1316. Similarly, FIG. 13 shows the program in high level language 1302 may be compiled using an alternative instruction set compiler 1308 to generate alternative instruction set binary code 1310 that may be natively executed by a processor without at least one x86 instruction set core 1314 (e.g., a processor with cores that execute the MIPS instruction set of MIPS Technologies of Sunnyvale, Calif. and/or that execute the ARM instruction set of ARM Holdings of Sunnyvale, Calif.). Instruction converter 1312 may be used to convert x86 binary code 1306 into code that may be natively executed by the processor without an x86 instruction set core 1314. This converted code might not be the same as alternative instruction set binary code 1310; however, the converted code will accomplish the general operation and be made up of instructions from the alternative instruction set. Thus, instruction converter 1312 represents software, firmware, hardware, or a combination thereof that, through emulation, simulation or any other process, allows a processor or other electronic device that does not have an x86 instruction set processor or core to execute x86 binary code 1306.

Figure 14:
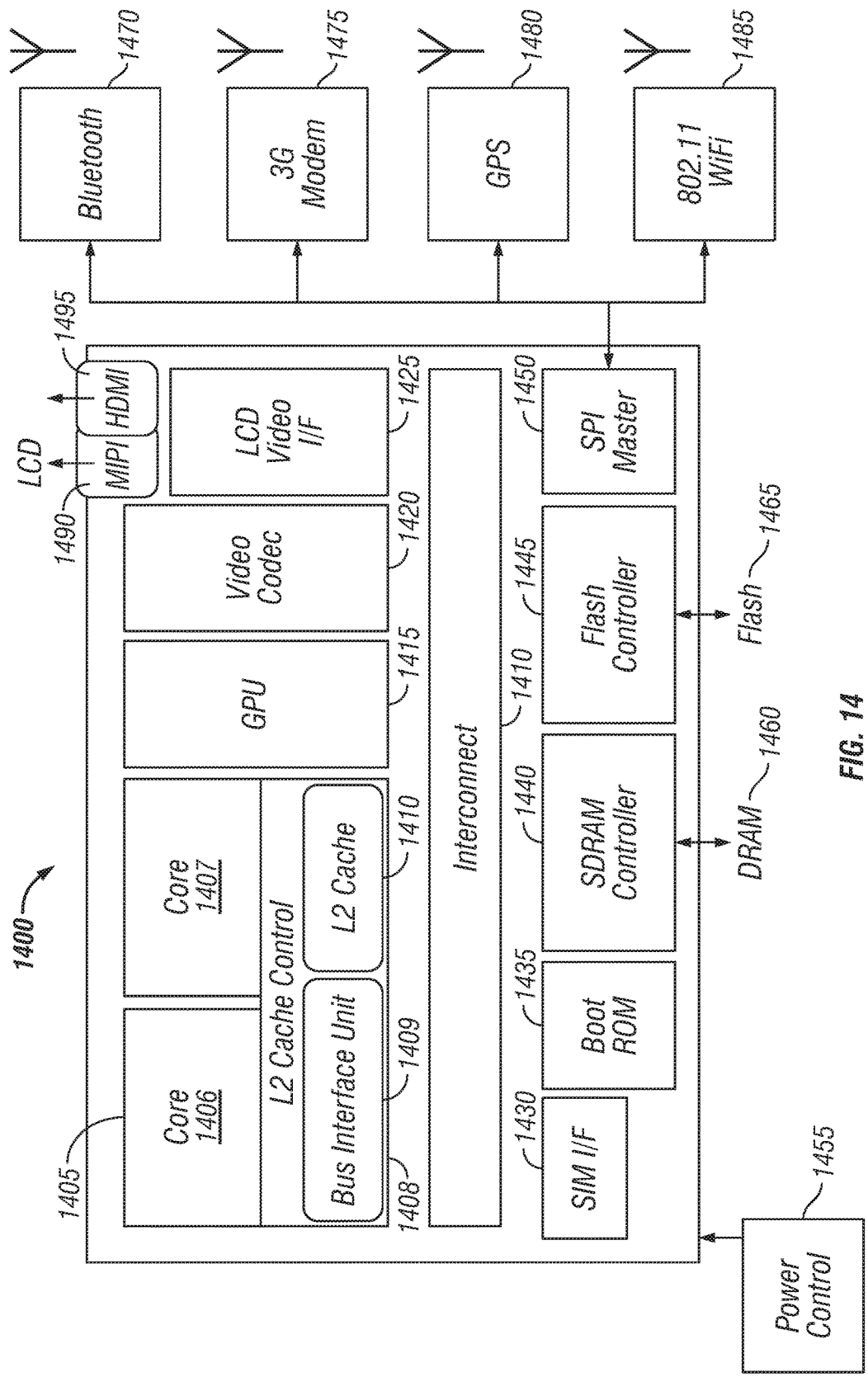
FIG. 14 is a block diagram of an instruction set architecture of a processor, in accordance with embodiments of the present disclosure.

FIG. 14 is a block diagram of an instruction set architecture 1400 of a processor, in accordance with embodiments of the present disclosure. Instruction set architecture 1400 may include any suitable number or kind of components.

For example, instruction set architecture 1400 may include processing entities such as one or more cores 1406, 1407 and a graphics processing unit 1415. Cores 1406, 1407 may be communicatively coupled to the rest of instruction set architecture 1400 through any suitable mechanism, such as through a bus or cache. In one embodiment, cores 1406, 1407 may be communicatively coupled through an L2 cache control 1408, which may include a bus interface unit 1409 and an L2 cache 1410. Cores 1406, 1407 and graphics processing unit 1415 may be communicatively coupled to each other and to the remainder of instruction set architecture 1400 through interconnect 1410. In one embodiment, graphics processing unit 1415 may use a video code 1420 defining the manner in which particular video signals will be encoded and decoded for output.

Instruction set architecture 1400 may also include any number or kind of interfaces, controllers, or other mechanisms for interfacing or communicating with other portions of an electronic device or system. Such mechanisms may facilitate interaction with, for example, peripherals, communications devices, other processors, or memory. In the example of FIG. 14, instruction set architecture 1400 may include a liquid crystal display (LCD) video interface 1425, a subscriber interface module (SIM) interface 1430, a boot ROM interface 1435, a synchronous dynamic random access memory (SDRAM) controller 1440, a flash controller 1445, and a serial peripheral interface (SPI) master unit 1450. LCD video interface 1425 may provide output of video signals from, for example, GPU 1415 and through, for example, a mobile industry processor interface (MIPI) 1490 or a high-definition multimedia interface (HDMI) 1495 to a display. Such a display may include, for example, an LCD. SIM interface 1430 may provide access to or from a SIM card or device. SDRAM controller 1440 may provide access to or from memory such as an SDRAM chip or module. Flash controller 1445 may provide access to or from memory such as flash memory or other instances of RAM. SPI master unit 1450 may provide access to or from communications modules, such as a Bluetooth module 1470, high-speed 3G modem 1475, global positioning system module 1480, or wireless module 1485 implementing a communications standard such as 802.11.

Figure 15:
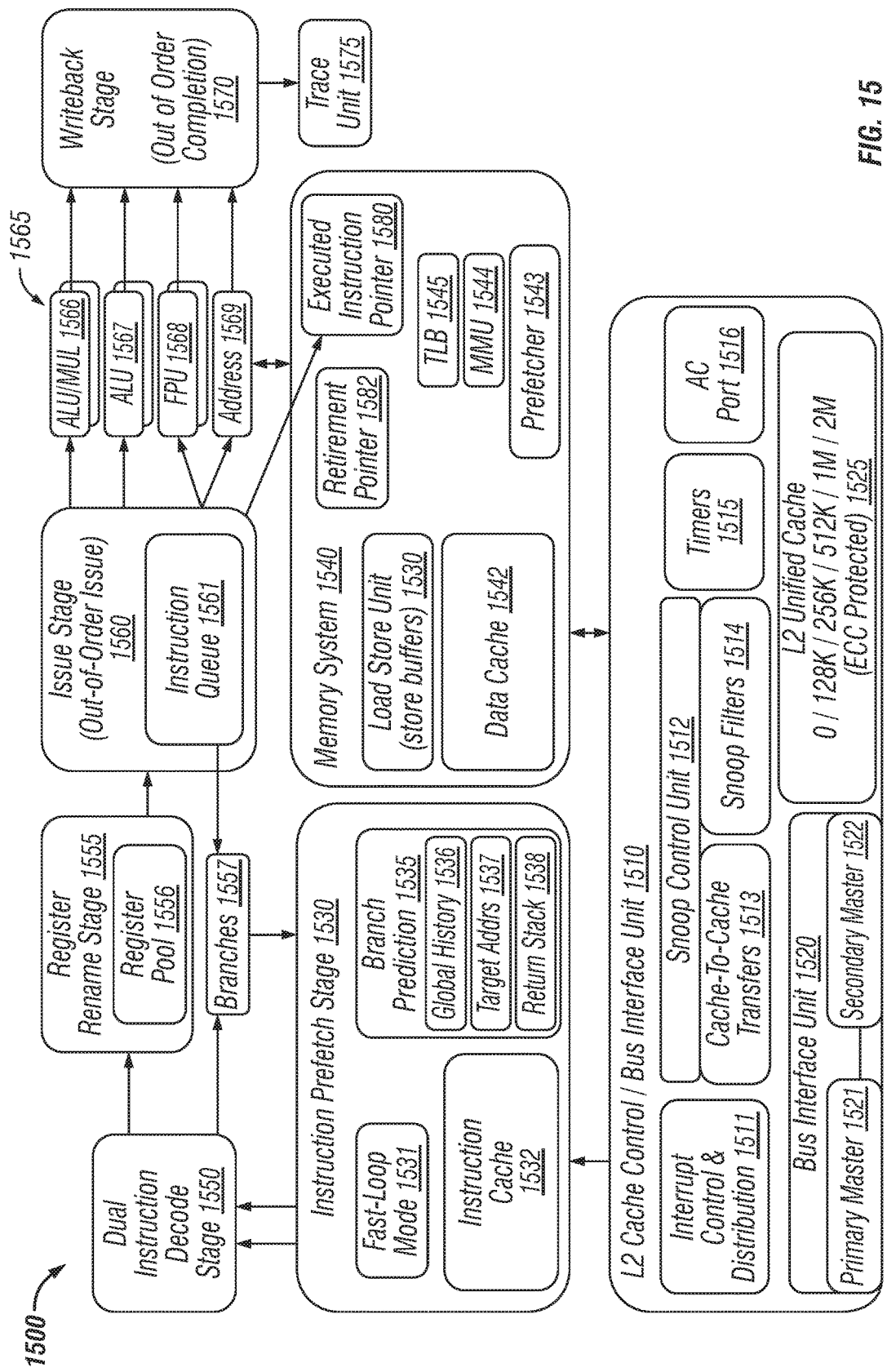
FIG. 15 is a more detailed block diagram of an instruction set architecture of a processor, in accordance with embodiments of the present disclosure.

FIG. 15 is a more detailed block diagram of an instruction set architecture 1500 of a processor, in accordance with embodiments of the present disclosure. Instruction architecture 1500 may implement one or more aspects of instruction set architecture 1400. Furthermore, instruction set architecture 1500 may illustrate modules and mechanisms for the execution of instructions within a processor.

Instruction architecture 1500 may include a memory system 1540 communicatively coupled to one or more execution entities 1565. Furthermore, instruction architecture 1500 may include a caching and bus interface unit such as unit 1510 communicatively coupled to execution entities 1565 and memory system 1540. In one embodiment, loading of instructions into execution entities 1564 may be performed by one or more stages of execution. Such stages may include, for example, instruction prefetch stage 1530, dual instruction decode stage 1550, register rename stage 155, issue stage 1560, and writeback stage 1570.

Execution entities 1565 may include any suitable number and kind of mechanisms by which a processor may execute instructions. In the example of FIG. 15, execution entities 1565 may include ALU/multiplication units (MUL) 1566, ALUs 1567, and floating point units (FPU) 1568. In one embodiment, such entities may make use of information contained within a given address 1569. Execution entities 1565 in combination with stages 1530, 1550, 1555, 1560, 1570 may collectively form an execution unit.

Unit 1510 may be implemented in any suitable manner. In one embodiment, unit 1510 may perform cache control. In such an embodiment, unit 1510 may thus include a cache 1525. Cache 1525 may be implemented, in a further embodiment, as an L2 unified cache with any suitable size, such as zero, 128k, 256k, 512k, 1M, or 2M bytes of memory. In another, further embodiment, cache 1525 may be implemented in error-correcting code memory. In another embodiment, unit 1510 may perform bus interfacing to other portions of a processor or electronic device. In such an embodiment, unit 1510 may thus include a bus interface unit 1520 for communicating over an interconnect, intraprocessor bus, interprocessor bus, or other communication bus, port, or line. Bus interface unit 1520 may provide interfacing in order to perform, for example, generation of the memory and input/output addresses for the transfer of data between execution entities 1565 and the portions of a system external to instruction architecture 1500.

To further facilitate its functions, bus interface unit 1520 may include an interrupt control and distribution unit 1511 for generating interrupts and other communications to other portions of a processor or electronic device. In one embodiment, bus interface unit 1520 may include a snoop control unit 1512 that handles cache access and coherency for multiple processing cores. In a further embodiment, to provide such functionality, snoop control unit 1512 may include a cache-to-cache transfer unit that handles information exchanges between different caches. In another, further embodiment, snoop control unit 1512 may include one or more snoop filters 1514 that monitors the coherency of other caches (not shown) so that a cache controller, such as unit 1510, does not have to perform such monitoring directly. Unit 1510 may include any suitable number of timers 1515 for synchronizing the actions of instruction architecture 1500. Also, unit 1510 may include an AC port 1516.

Memory system 1540 may include any suitable number and kind of mechanisms for storing information for the processing needs of instruction architecture 1500. In one embodiment, memory system 1504 may include a load store unit 1530 for storing information such as buffers written to or read back from memory or registers. In another embodiment, memory system 1504 may include a translation lookaside buffer (TLB) 1545 that provides look-up of address values between physical and virtual addresses. In yet another embodiment, bus interface unit 1520 may include a memory management unit (MMU) 1544 for facilitating access to virtual memory. In still yet another embodiment, memory system 1504 may include a prefetcher 1543 for requesting instructions from memory before such instructions are actually needed to be executed, in order to reduce latency.

The operation of instruction architecture 1500 to execute an instruction may be performed through different stages. For example, using unit 1510 instruction prefetch stage 1530 may access an instruction through prefetcher 1543. Instructions retrieved may be stored in instruction cache 1532. Prefetch stage 1530 may enable an option 1531 for fast-loop mode, and a series of instructions forming a loop that is small enough to fit within a given cache are executed. In one embodiment, such an execution may be performed without needing to access additional instructions from, for example, instruction cache 1532. Determination of what instructions to prefetch may be made by, for example, branch prediction unit 1535, which may access indications of execution in global history 1536, indications of target addresses 1537, or contents of a return stack 1538 to determine which of branches 1557 of code will be executed next. Such branches may be possibly prefetched as a result. Branches 1557 may be produced through other stages of operation as described below. Instruction prefetch stage 1530 may provide instructions as well as any predictions about future instructions to dual instruction decode stage.

Dual instruction decode stage 1550 may translate a received instruction into microcode-based instructions that may be executed. Dual instruction decode stage 1550 may simultaneously decode two instructions per clock cycle. Furthermore, dual instruction decode stage 1550 may pass its results to register rename stage 1555. In addition, dual instruction decode stage 1550 may determine any resulting branches from its decoding and eventual execution of the microcode. Such results may be input into branches 1557.

Register rename stage 1555 may translate references to virtual registers or other resources into references to physical registers or resources. Register rename stage 1555 may include indications of such mapping in a register pool 1556. Register rename stage 1555 may alter the instructions as received and send the result to issue stage 1560.

Issue stage 1560 may issue or dispatch commands to execution entities 1565. Such issuance may be performed in an out-of-order fashion. In one embodiment, multiple instructions may be held at issue stage 1560 before being executed. Issue stage 1560 may include an instruction queue 1561 for holding such multiple commands. Instructions may be issued by issue stage 1560 to a particular processing entity 1565 based upon any acceptable criteria, such as availability or suitability of resources for execution of a given instruction. In one embodiment, issue stage 1560 may reorder the instructions within instruction queue 1561 such that the first instructions received might not be the first instructions executed. Based upon the ordering of instruction queue 1561, additional branching information may be provided to branches 1557. Issue stage 1560 may pass instructions to executing entities 1565 for execution.

Upon execution, writeback stage 1570 may write data into registers, queues, or other structures of instruction set architecture 1500 to communicate the completion of a given command. Depending upon the order of instructions arranged in issue stage 1560, the operation of writeback stage 1570 may enable additional instructions to be executed. Performance of instruction set architecture 1500 may be monitored or debugged by trace unit 1575.

Figure 16:
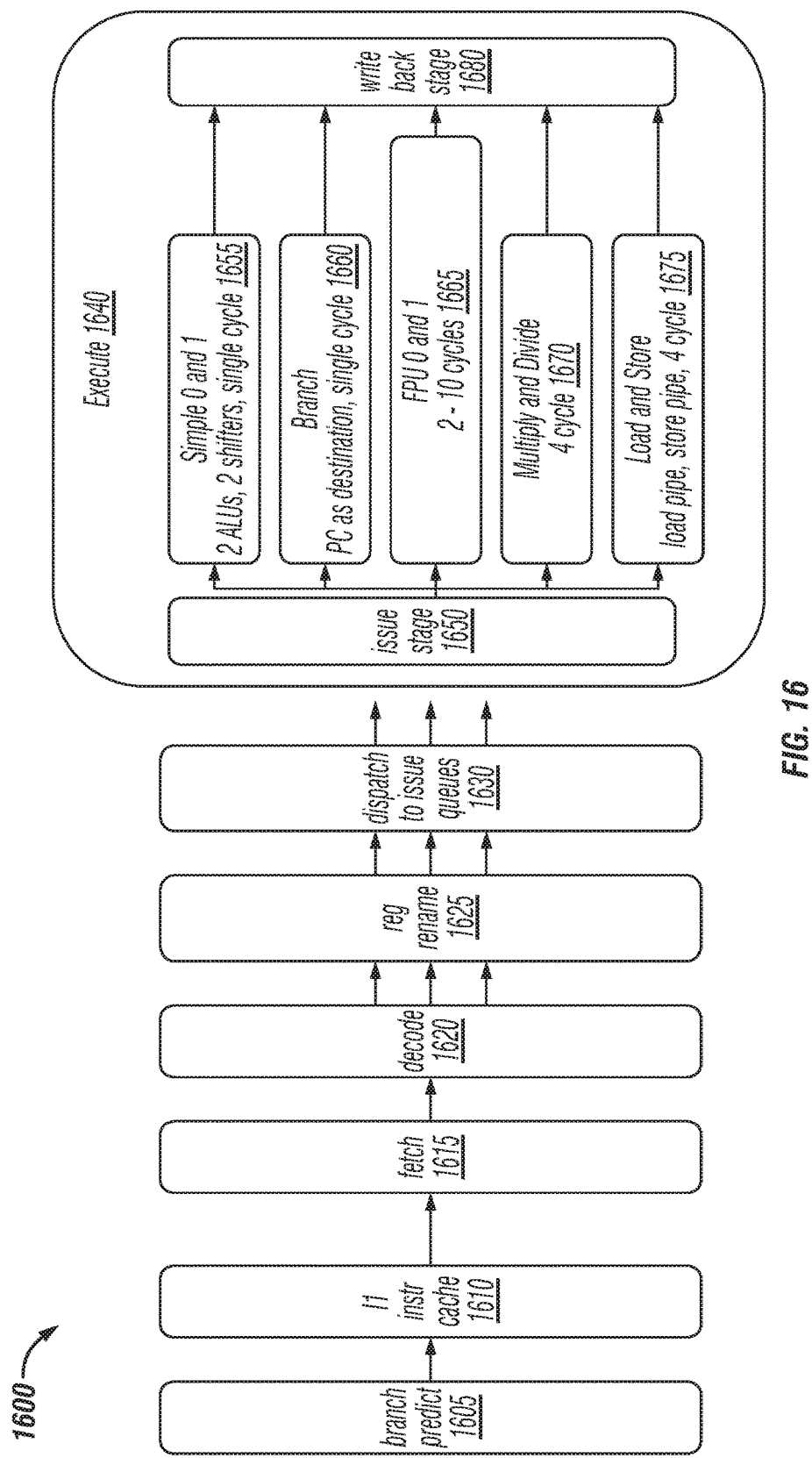
FIG. 16 is a block diagram of an execution pipeline for an instruction set architecture of a processor, in accordance with embodiments of the present disclosure.

FIG. 16 is a block diagram of an execution pipeline 1600 for an instruction set architecture of a processor, in accordance with embodiments of the present disclosure. Execution pipeline 1600 may illustrate operation of, for example, instruction architecture 1500 of FIG. 15.

Execution pipeline 1600 may include any suitable combination of steps or operations. In 1605, predictions of the branch that is to be executed next may be made. In one embodiment, such predictions may be based upon previous executions of instructions and the results thereof. In 1610, instructions corresponding to the predicted branch of execution may be loaded into an instruction cache. In 1615, one or more such instructions in the instruction cache may be fetched for execution. In 1620, the instructions that have been fetched may be decoded into microcode or more specific machine language. In one embodiment, multiple instructions may be simultaneously decoded. In 1625, references to registers or other resources within the decoded instructions may be reassigned. For example, references to virtual registers may be replaced with references to corresponding physical registers. In 1630, the instructions may be dispatched to queues for execution. In 1640, the instructions may be executed. Such execution may be performed in any suitable manner. In 1650, the instructions may be issued to a suitable execution entity. The manner in which the instruction is executed may depend upon the specific entity executing the instruction. For example, at 1655, an ALU may perform arithmetic functions. The ALU may utilize a single clock cycle for its operation, as well as two shifters. In one embodiment, two ALUs may be employed, and thus two instructions may be executed at 1655. At 1660, a determination of a resulting branch may be made. A program counter may be used to designate the destination to which the branch will be made. 1660 may be executed within a single clock cycle. At 1665, floating point arithmetic may be performed by one or more FPUs. The floating point operation may require multiple clock cycles to execute, such as two to ten cycles. At 1670, multiplication and division operations may be performed. Such operations may be performed in four clock cycles. At 1675, loading and storing operations to registers or other portions of pipeline 1600 may be performed. The operations may include loading and storing addresses. Such operations may be performed in four clock cycles. At 1680, write-back operations may be performed as required by the resulting operations of 1655-1675.

Figure 17:
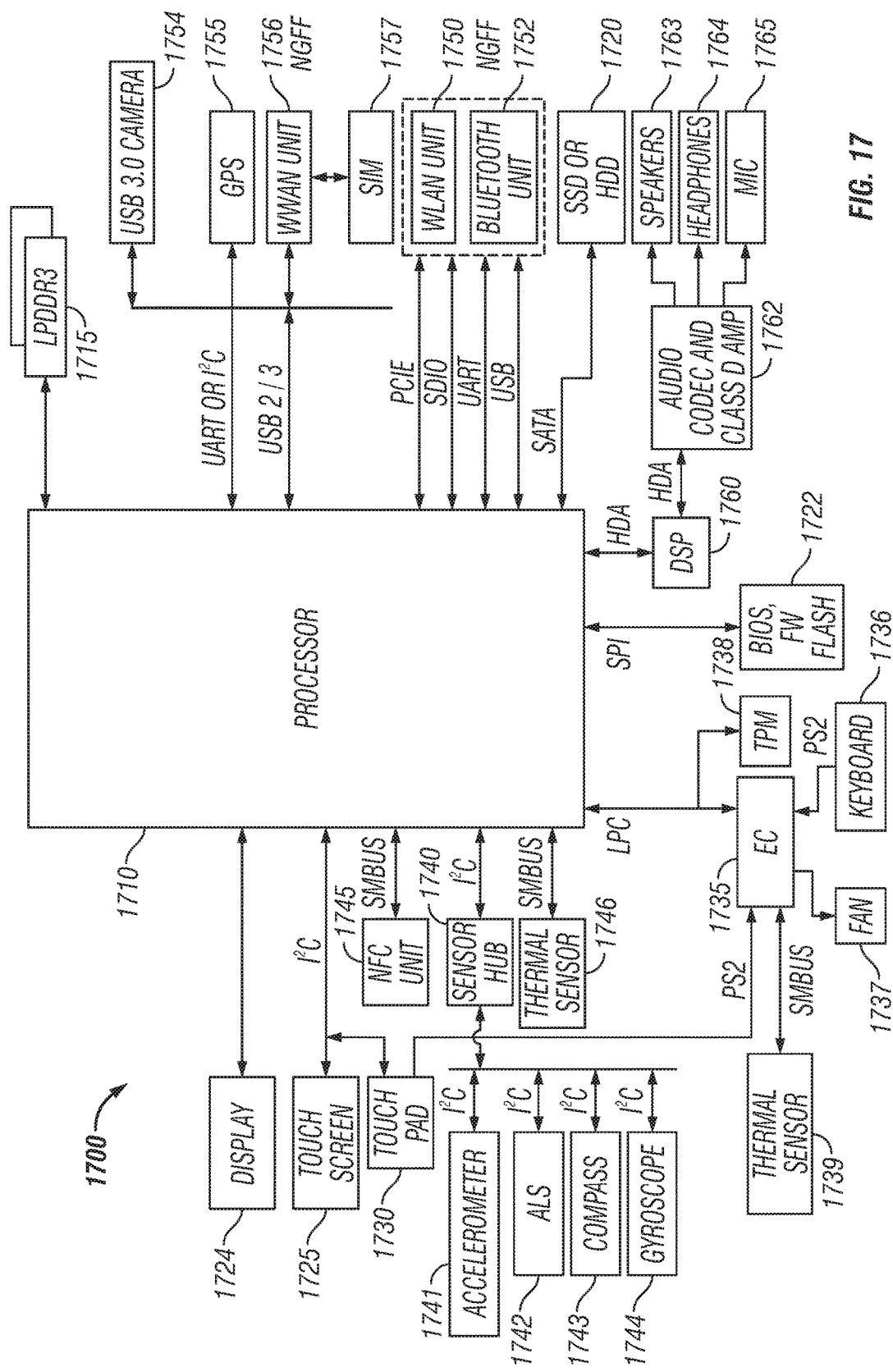
FIG. 17 is a block diagram of an electronic device for utilizing a processor, in accordance with embodiments of the present disclosure.

FIG. 17 is a block diagram of an electronic device 1700 for utilizing a processor 1710, in accordance with embodiments of the present disclosure. Electronic device 1700 may include, for example, a notebook, an ultrabook, a computer, a tower server, a rack server, a blade server, a laptop, a desktop, a tablet, a mobile device, a phone, an embedded computer, or any other suitable electronic device.

Electronic device 1700 may include processor 1710 communicatively coupled to any suitable number or kind of components, peripherals, modules, or devices. Such coupling may be accomplished by any suitable kind of bus or interface, such as I$^2$C bus, system management bus (SMBus), low pin count (LPC) bus, SPI, high definition audio (HDA) bus, Serial Advance Technology Attachment (SATA) bus, USB bus (versions 1, 2, 3), or Universal Asynchronous Receiver/Transmitter (UART) bus.

Such components may include, for example, a display 1724, a touch screen 1725, a touch pad 1730, a near field communications (NFC) unit 1745, a sensor hub 1740, a thermal sensor 1746, an express chipset (EC) 1735, a trusted platform module (TPM) 1738, BIOS/firmware/flash memory 1722, a digital signal processor 1760, a drive 1720 such as a solid state disk (SSD) or a hard disk drive (HDD), a wireless local area network (WLAN) unit 1750, a Bluetooth unit 1752, a wireless wide area network (WWAN) unit 1756, a global positioning system (GPS), a camera 1754 such as a USB 3.0 camera, or a low power double data rate (LPDDR) memory unit 1715 implemented in, for example, the LPDDR3 standard. These components may each be implemented in any suitable manner.

Furthermore, in various embodiments other components may be communicatively coupled to processor 1710 through the components discussed above. For example, an accelerometer 1741, ambient light sensor (ALS) 1742, compass 1743, and gyroscope 1744 may be communicatively coupled to sensor hub 1740. A thermal sensor 1739, fan 1737, keyboard 1746, and touch pad 1730 may be communicatively coupled to EC 1735. Speaker 1763, headphones 1764, and a microphone 1765 may be communicatively coupled to an audio unit 1764, which may in turn be communicatively coupled to DSP 1760. Audio unit 1764 may include, for example, an audio codec and a class D amplifier. A SIM card 1757 may be communicatively coupled to WWAN unit 1756. Components such as WLAN unit 1750 and Bluetooth unit 1752, as well as WWAN unit 1756 may be implemented in a next generation form factor (NGFF).

Embodiments of the present disclosure involve logic in a processor for implementing a reconfigurable test access port with finite state machine control.

Figure 18:
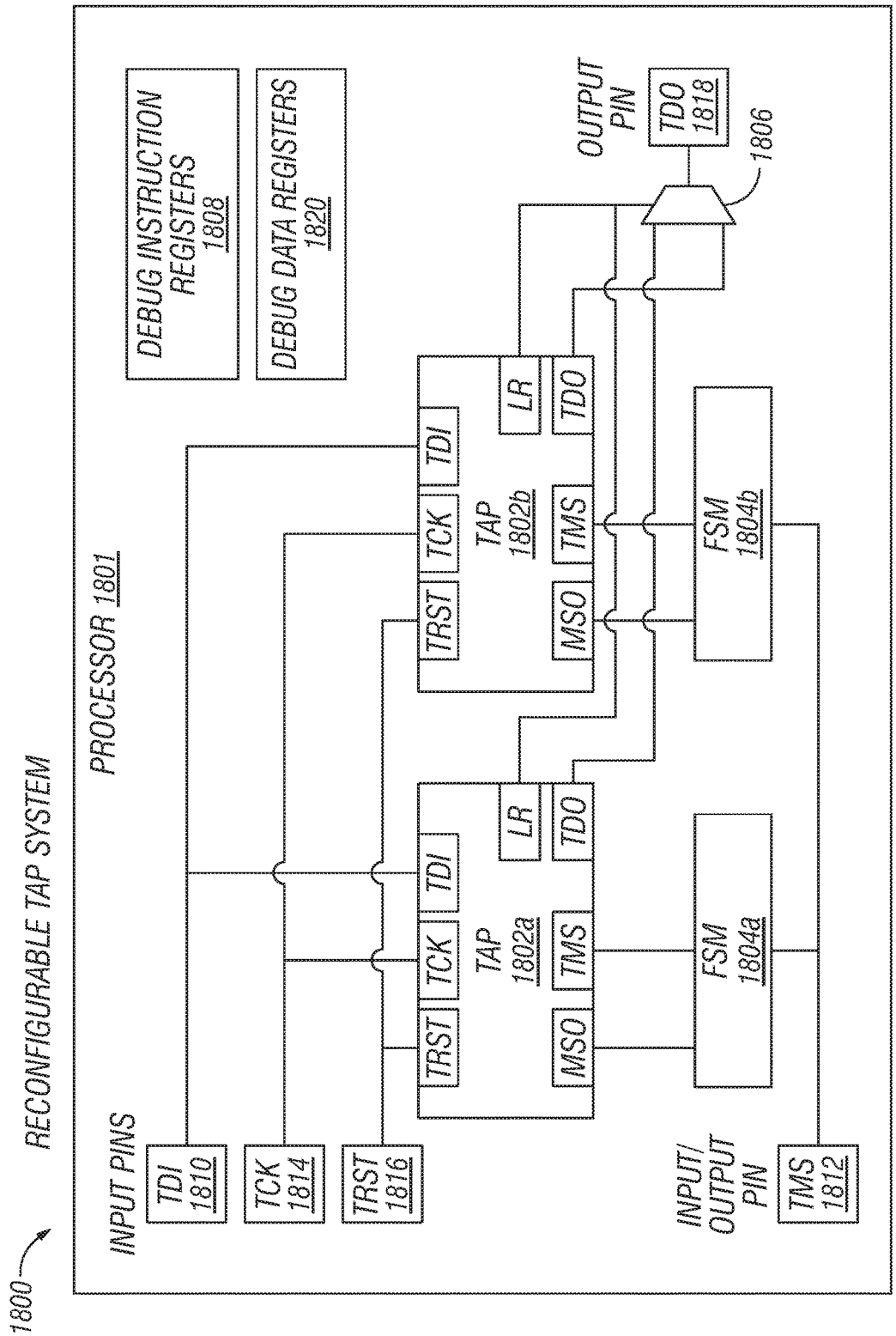
FIG. 18 illustrates an example embodiment of a reconfigurable test access port system for implementing a reconfigurable test access port with finite state machine control, in accordance with embodiments of the present disclosure.

FIG. 18 illustrates an example embodiment of a reconfigurable TAP system 1800 for implementing, in processor 1801, a reconfigurable test access port with finite state machine control, in accordance with embodiments of the present disclosure.

As noted, different test access port standards may have architectural differences that prevent or limit interoperability of a processor test access port with different external debugging tools. For example JTAG (IEEE 1149.1) adds 4 connector pins and 1 optional pin to a processor pinout to enable serial daisy-chaining of different test access ports (TAP) that may respectively support different components under test within a processor. JTAG (IEEE 1149.7) and SWD may add 2 connector pins to a processor pinout and enable a star or parallel topology of different test access ports. The pinouts of these three common standards are summarized in Table 1. It is noted that ground connections with regard to the following description and figures of test access ports have been omitted for clarity.

TABLE 1

Pinouts of common TAP standards

| JTAG (IEEE 1149.1) | JTAG (IEEE 1149.7) | SWD |
|---|---|---|
| TDI - Test Data In | | |
| TDO - Test Data Out | | |
| TCK - Test Clock In | TCK - Test Clock In | SWCLK - Test Clock In |
| TMS - Test Mode Select In | TMSC - Test Serial Data In/Out | SWDIO - Data In/Out |
| TRST - Test Reset In (optional) | | |

It is noted that, while SWD may refer to a Data Access Port (DAP) instead of a test access port, the term "test access port" or "TAP" is used herein to represent both JTAG TAPs and SWD DAPS where each standard is specifically referenced in context of the description.

Because of architectural differences between the standards shown in Table 1, interoperability among the different standards may be limited. For example, when using JTAG (IEEE 1149.1) having a daisy-chain configuration, access to all test access ports occurs via a primary test access port controller that provides access to subsidiary test access ports (subTAPs). In this case, a bypass instruction is added to each test command for addressing the subTAPs, which generates additional bits in the test procedure and may increase test time, particularly when greater numbers of subTAPs are present. For these reasons, the use of a 2-pin test access port standard, such as JTAG (IEEE 1149.7) or SWD, may be desired because of the parallel topology that enables direct access to all test access ports at a single hierarchical level.

Because the test access ports are implemented in hardware on processor 1801, implementing interoperability involves supporting different test access port interfaces. Since pinouts of processor 1801 are valuable resources, it may be desirable to reuse certain pins when implementing different test access port interfaces. For example, the TCK and TMS pins may be reused for a 2-pin test access port interface on a processor having a 5-pin JTAG (IEEE 1149.1) interface. However, because the primary JTAG (IEEE 1149.1) test access port may depend on TCK and TMS for a security state and certain debug settings that are stored in data registers (DR), reusing the TMS pin, in particular, for a 2-pin test access port interface may place the primary JTAG (IEEE 1149.1) test access port into an unknown state when the test access port interface is reused, which is undesirable. Furthermore, the use of a parallel test access port architecture, in which all test access ports are accessed directly and have the same priority, may also be desired. For example, in a parallel test access port architecture, test access ports that are unused may remain idle, and so, may consume little or no power.

As will be described in further detail, logic in processor 1801 may implement a reconfigurable TAP system 1800 having a parallel architecture with finite state machine control of TMS pin 1812 (also referred to as a "processor test mode connector") using finite state machine 1804. In this manner, both JTAG test access port interfaces and serial wire debug test access port interfaces may be concurrently supported by reconfigurable TAP system 1800. Reconfigurable TAP system 1800 with finite state machine control may also enable unused pins to be reused for other purposes when test access port 1802 is accessed using a low pin count test access port interface. Reconfigurable TAP system 1800 with finite state machine control described herein may further enable processor 1802 to support the use of different testing infrastructure, such as testing equipment and code, thereby enabling greater compatibility and ease of use of processor 1801.

In reconfigurable TAP system 1800 shown in FIG. 18, test access ports 1802a and 1802b are shown representing a plurality of test access ports 1802. It will be understood that the plurality of test access ports 1802 may include larger numbers of test access ports 1802. In certain embodiments, test access port 1802a may include a primary test access port controller and may have certain debug mode control over other test access ports, such as test access port 1802b. In some embodiments, all test access ports 1802 are substantially similar in implementation and functionality.

Test access port 1802, represented by test access port 1802a and 1802b in FIG. 18, may include various inputs and outputs. In test access port 1802, TDI may be Test Data In connected to input pin TDI 1810 of processor 1801. In test access port 1802, TCK may be Test Clock In connected to input pin TCK 1814 of processor 1801. In test access port 1802, TRST may be Test Reset In connected to input pin TRST 1816 of processor 1801. In test access port 1802, TDO may be Test Data Out connected to output pin TDO 1818 of processor 1801. In reconfigurable test access port system 1800, TDI 1810, TDO 1818, and TRST 1816, when present, may be reusable connections to the respective processor input pins. For example, when unused, TDI 1810, TDO 1818, and TRST 1816 may be pins used for other debug purposes or other general purposes on processor 1801.

In reconfigurable TAP system 1800, an output connection to TDO 1818 may be selected using multiplexer 1806 from among TDOs of test access ports 1802. For this purpose, test access port 1802 may have lock registers (LR) that operate in conjunction with finite state machine 1804. The LR may include 1 bit for each test access port 1802 on the processor and each test access port 1802 may maintain an instance of the LR. In this manner, each test access port 1802 may be aware of a lock state of each other test access port 1802 in reconfigurable TAP system 1800. A single LR or a combination of LRs may accordingly be used to switch a single TDO from test access ports 1802 to TDO 1818. It is noted that LRs may be linked to a global lock register included in debug data registers 1820.

Also, reconfigurable TAP system 1800 may use debug instruction registers 1808 and debug data registers 1820 to control finite state machines 1804. Debug instruction registers 1808 may be controlled by an external test system operating reconfigurable TAP system 1800 to define commands and events for a particular test purpose. Debug instruction registers 1808 may have specific bits for addressing particular test access ports 1802 as well as commands for test access ports 1802 and finite state machines 1804. Debug data registers 1820 may be used in conjunction with test access ports 1802 to store debug state information or other data for test or debug purposes. For example, debug data registers 1820 may store state values associated with finite state machine 1804, for example, when test access port 1802 is idle or inactive, such that test access port 1802 may resume operation from a defined state. Debug data registers 1820 may further include a global lock register.

In reconfigurable TAP system 1800, finite state machine 1804a may be dedicated to test access port 1802a, finite state machine 1804b may be dedicated to test access port 1802b, and so on, up to a desired number of test access ports 1802 and finite state machines 1804. Finite state machine 1804 may control connection and use of TMS 1812, which may be an input pin or a bidirectional pin, depending on a selected test interface used with reconfigurable TAP system 1800 at a particular time. For example, when test access port 1802 implements a JTAG (IEEE 1149.1) test interface, TMS may be a Test Mode Select input connected to TMS 1812. When test access port 1802 implements a JTAG (IEEE 1149.7) or SWD test interface, TMS may be a serial data input/output connected to TMS 1812.

In reconfigurable TAP system 1800, also associated with finite state machine 1804 is mode select output (MSO), shown as an output from test access port 1802 to finite state machine 1804. The mode select output from test access port 1802 may indicate to finite state machine 1804 whether test access port 1802 is operating using JTAG or SWD protocols and test interfaces. It is noted that different procedures may be used to switch from JTAG and SWD test interfaces. In one embodiment, a change in debug instruction register

1808 may cause test access port 1802 to change between JTAG and SWD test interfaces, which may be indicated by the mode select output to finite state machine 1804. In given embodiments, a particular input sequence on TMS 1812, such as a 16-bit switching sequence, may be used to switch between JTAG and SWD test interfaces, which may be indicated by the mode select output to finite state machine 1804.

Figure 19:
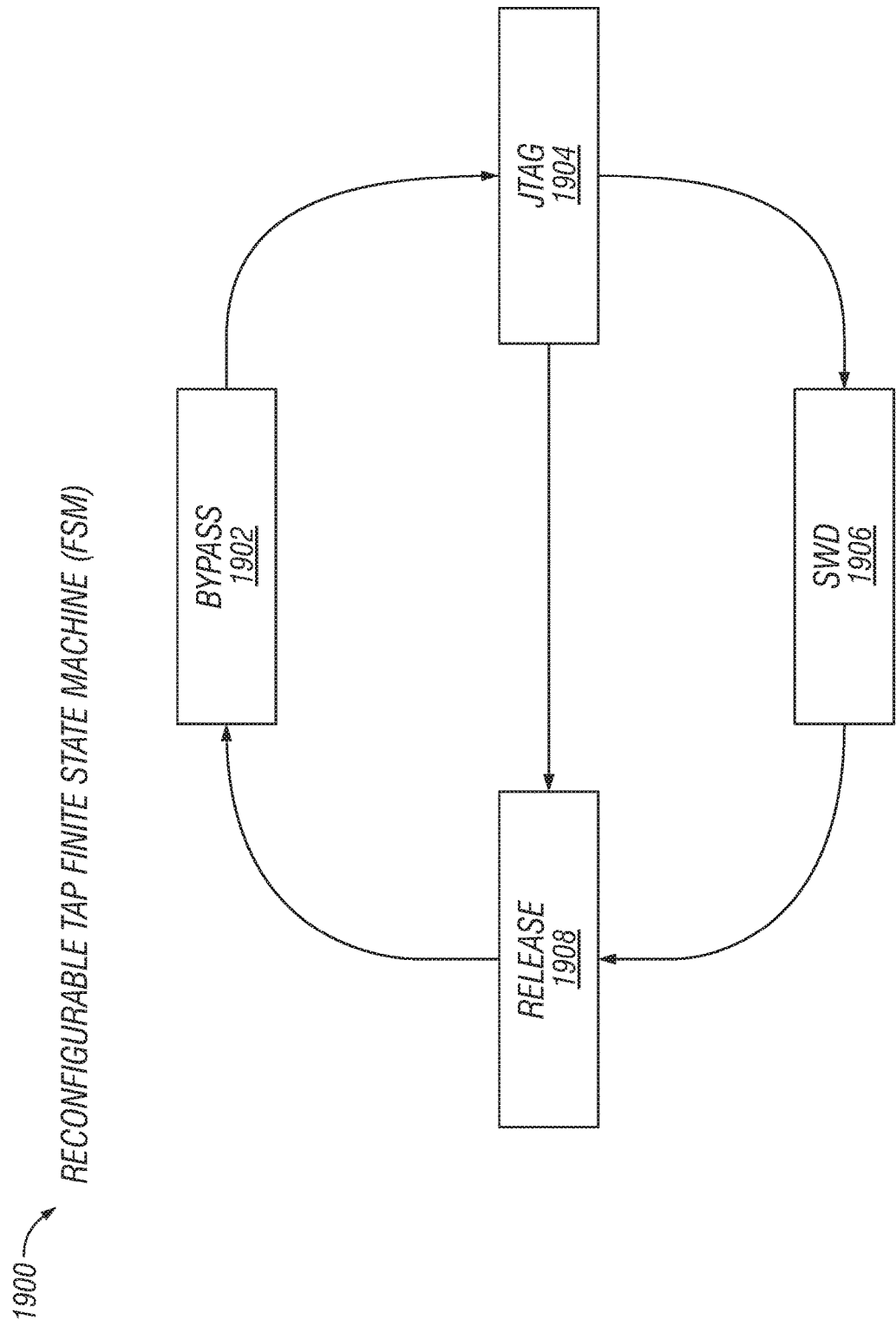
FIG. 19 illustrates an example embodiment of a reconfigurable test access port finite state machine for implementing a reconfigurable test access port with finite state machine control, in accordance with embodiments of the present disclosure.

FIG. 19 illustrates an example embodiment of a reconfigurable TAP finite state machine 1900 for implementing, in processor 1801, a reconfigurable test access port with finite state machine control, in accordance with embodiments of the present disclosure. Finite state machine 1900 may be an embodiment of finite state machine 1804 in FIG. 18.

In finite state machine 1900, four states are shown. Bypass 1902 may be a starting or base state in which all test access ports 1802 are in an idle state and TMS 1812 is not connected to any test access port 1802. In bypass 1902, finite state machine 1900 may output a value from debug data register 1820 to TMS in test access port 1802 to maintain test access port 1802 at a desired state. In bypass 1902, all values for LR for all test access ports 1802 may be zero or may have no set bits. When finite state machine 1900 is in bypass 1902, all finite state machines 1900 for all test access ports 1802 are in bypass 1902. In bypass 1902, reconfigurable TAP system 1800 may consume little or no power. Bypass 1902 may be reached by release 1908, which is described in further detail below. In certain embodiments, test access ports 1802 may implement a JTAG test interface by default when finite state machine 1900 is in bypass 1902. Thus, in bypass 1902, each test access port 1802 may be in a JTAG test-logic-reset state.

JTAG 1904 may be an operational state in finite state machine 1900. When finite state machine 1900 transitions to JTAG 1904, all test access ports 1802 may transition to JTAG 1904 in all finite state machines 1900. Correspondingly, each test access port 1802 may transition to a JTAG run-test/idle state upon entering JTAG 1904. However, only one test access port 1802, as designated by a set bit in LR, may be locked and may actively use certain test interface pins at a given time. For example, first test access port 1802*a* may be activated and a bit in LR corresponding to first test access port 1802*a* may be set. In certain embodiments, transitioning finite state machine 1900 to JTAG 1904 and selection of the first test access port may be accomplished using debug instruction registers 1808.

Since each test access port 1802 maintains LR, all test access ports 1802 are aware that first test access port 1802*a* is active. In JTAG 1904, first test access port 1802*a* may be enabled for operation using a JTAG (IEEE 1149.1) test interface, as described above. In JTAG 1904, first test access port 1802*a* may be enabled for operation using a JTAG (IEEE 1149.7) test interface, as described above. All other test access ports 1802 except 1802*a* may remain idle in JTAG 1904, even though respective finite state machines 1804 (corresponding to finite state machine 1900) for all other test access ports 1802 may remain in JTAG 1904.

While first finite state machine 1804*a* (corresponding to finite state machine 1900) is in JTAG 1904, first test access port 1802*a* may leave the JTAG run-test/idle state and begin performing JTAG scans to implement desired test interface activity. The transition to and from the JTAG run-test/idle state may be controlled by user input via TMS 1812. Because inputs to first test access port 1802*a* from TMS 1812 are routed through first finite state machine 1804*a*, first finite state machine 1804*a* may be aware of a particular JTAG state or activity that first test access port 1802*a* is presently engaged in. When JTAG test interface activity concludes while first finite state machine 1804*a* is in JTAG 1904, first test access port 1802*a* may return to the JTAG run-test/idle state, which may cause first finite state machine 1804*a* to transition to release 1908, clear the lock register bit for first finite state machine 1804*a*, and then transition back to bypass 1902.

However, while first finite state machine 1804*a* is in JTAG 1904, first test access port 1802*a* may receive a switching command, for example via TMS 1812, to switch from a JTAG test interface to a serial wire debug test interface. The switching command may be a JTAG-SWD switching command, such as a certain 16-bit sequence received at the TMS input to first test access port 1802*a*. When the switching command is received at first test access port 1802*a*, first test access port 1802*a* may indicate internal implementation of the switching command by using the MSO output to first finite state machine 1804*a*. Upon receiving indication via the MSO input that first test access port 1802*a* has enabled a serial wire debug test interface, first finite state machine 1804*a* (corresponding to finite state machine 1900) may transition from JTAG 1904 to serial wire debug 1906. The hardware input from MSO to first finite state machine 1804*a* may have priority and may immediately be acted upon by first finite state machine 1804*a*. When first finite state machine 1804*a* is in serial wire debug 1906, all other remaining finite state machines 1804 may remain in JTAG 1904 and the lock register may continue to indicate that first test access port 1802*a* is locked for use.

While first finite state machine 1804*a* (corresponding to finite state machine 1900) is in serial wire debug 1906, a subsequent switching command to switch to a JTAG test interface may be received by first test access port 1802*a*, similar to the switching command described above. Then, first test access port 1802*a* may indicate the subsequent switching command using the MSO output to first finite state machine 1804*a*. Upon detecting the change from the MSO output of first test access port 1802*a*, first finite state machine 1804*a* may immediately transition to release 1908 clear the lock register bit for first finite state machine 1804*a*, and then transition back to bypass 1902.

In release 1908, automatic hardware control may disconnect TMS 1812 from all test access ports 1802 and all LRs may be reset to zero or no set bits and finite state machine 1900 may then transition back to bypass 1902. In this manner, a user or a software program operating test access ports 1802 may not have to unlock test access ports 1802 or may not have to manage states of finite state machine 1900 in order to use reconfigurable TAP system 1800.

Figure 20:
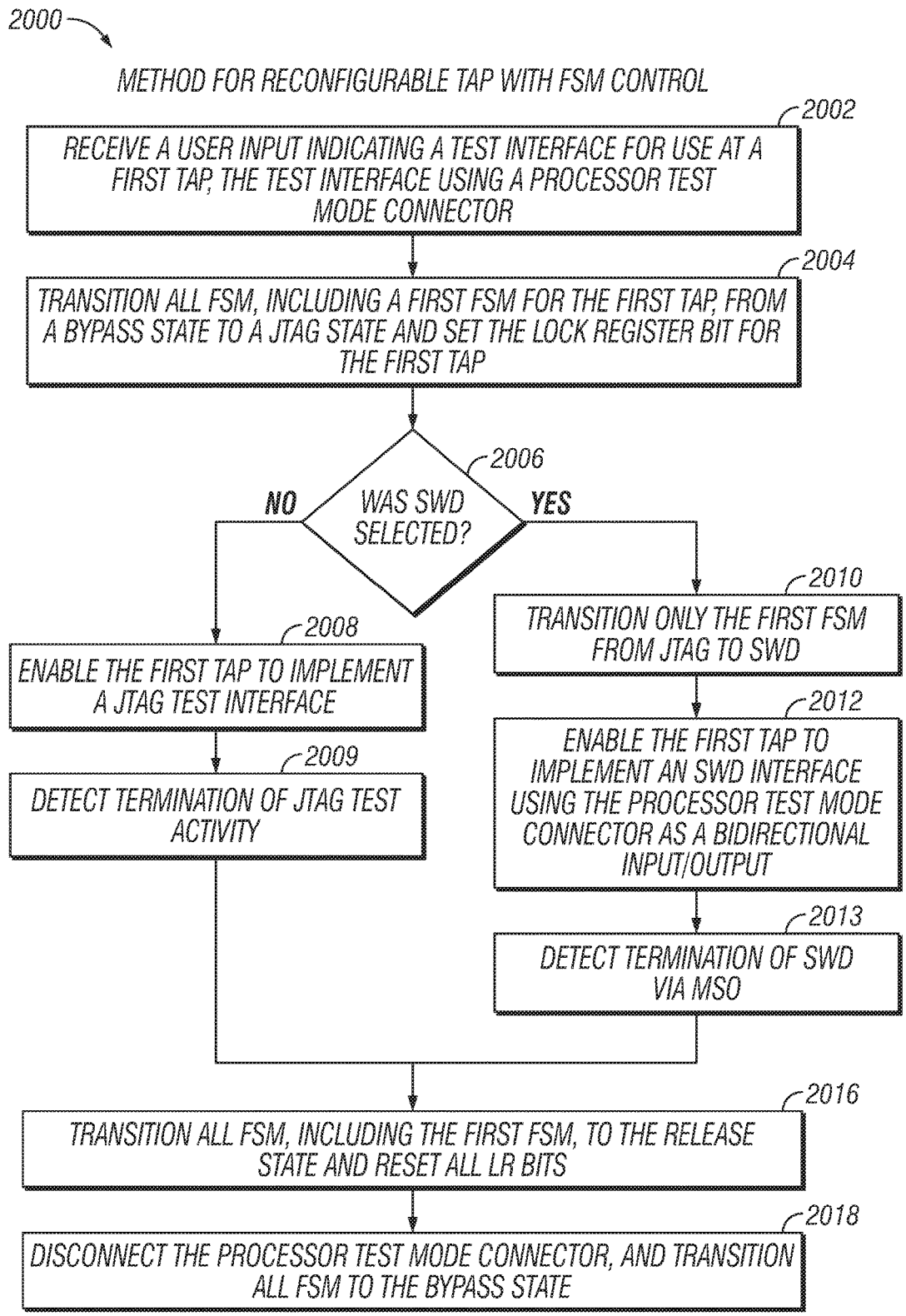
FIG. 20 is an illustration of an example method implementing a reconfigurable test access port with finite state machine control, in accordance with embodiments of the present disclosure.

FIG. 20 is an illustration of an example method 2000 for implementing, in a processor, a reconfigurable test access port with finite state machine control, in accordance with embodiments of the present disclosure.

At 2002, a user input may be received indicating a test interface for use at a first test access port, the test interface using a processor test mode connector. In 2002, the user input may be an access to a debug instruction register. The debug instruction register may be accessed by a user desiring access to the processor via the test interface. The access to the debug instruction register may involve register-level access to the processor to configure the test interface, in accordance with embodiments of the present disclosure. The first test access port may be an arbitrary one of a plurality of test access ports that are accessible via the test interface, in accordance with embodiments of the present disclosure. Each of the test access ports, such as test access port 1802, may be implemented with a respective finite state machine (FSM) 1804, as shown in FIG. 18, in accordance with embodiments of the present disclosure.

At 2004, all finite state machines, including a first finite state machine corresponding to the first test access port, may be transitioned from a bypass state to a JTAG state, and the lock register bit for the first test access port may be set. In this manner, all lock registers for all test access ports may be set to the same value indicating that the first test access port is locked. Based on a set bit in the lock register, a test data output from the first test access port may be routed to a test data output pin of the connector, while test data outputs from other test access ports are not connected.

At 2006, a decision may be made whether a serial wire debug test interface was selected. The selection of the serial wire debug interface may be made by sending the switching command, as described above, to the first test access port. In certain embodiments, the decision in 2006 may be made based on a value in the debug instruction register. In some embodiments, the decision in 2006 may be made based on a value in a debug data register associated with the debug instruction register. In particular embodiments, the decision in 2006 may be made based on a change in the MSO output from the first test access port. When the result of 2006 is NO, then a JTAG test interface test interface is selected. When the result of 2006 is YES, then a serial wire debug is selected.

At 2008, when the result of 2006 is NO, the first test access port is enabled to implement a JTAG test interface. A JTAG (IEEE 1149.1) test interface may use the processor test mode connector as an input. A JTAG (IEEE 1149.7) test interface may use the processor test mode connector as a bidirectional input/output. When the JTAG test interface is implemented or enabled, JTAG test activity may be performed by the user.

At 2009, termination of JTAG test activity may be detected. For example, the first finite state machine may detect that the first test access port has returned to the JTAG run-test/idle state to detect termination of JTAG test activity.

At 2010, when the result of 2006 is YES, only the first finite state machine is transitioned from the JTAG state to the serial wire debug state. All other finite state machines for all other test access ports may remain in the JTAG state. At 2012, the first test access port is enabled to implement the serial wire debug test interface using the processor test mode connector as a bidirectional input/output. At 2013, termination of the serial wire debug test interface may be detected by the first finite state machine via the MSO signal.

At 2016, all finite state machines, including the first finite state machine, may be transitioned to the release state and all lock register bits may be reset. At 2018, the processor test mode connector may be disconnected, and all finite state machines may transition to the bypass state.

Method 2000 may be initiated by any suitable criteria. Furthermore, although method 2000 describes an operation of particular elements, method 2000 may be performed by any suitable combination or type of elements. For example, method 2000 may be implemented by the elements illustrated in FIGS. 1-19 or any other system operable to implement method 2000. As such, the preferred initialization point for method 2000 and the order of the elements comprising method 2000 may depend on the implementation chosen. In some embodiments, some elements may be optionally omitted, repeated, or combined.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system may include any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine-readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Accordingly, embodiments of the disclosure may also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part-on and part-off processor.

A processor may include a test data output connector, a processor test mode connector, and a plurality of test access ports including a first test access port. In the processor, the first test access port may include a test clock input, a test data input, a test data output, a lock register including a first logic to control selection of the test data output to the test data output connector, a first test mode connector, and a first finite state machine coupled to the processor test mode connector. In the processor, the first finite state machine may include a second logic to implement a Joint Test Action Group (JTAG) state to enable the first test access port to implement a JTAG test interface, and a third logic to implement a serial wire debug state to enable the first test access port to implement a serial wire debug test interface.

In any of the disclosed embodiments of the processor, when the JTAG test interface is an IEEE 1149.1 test interface, the second logic may use the test clock input, the test data input, the first test mode connector as an input from the processor test mode connector, and the test data output. In any of the disclosed embodiments of the processor, when the JTAG test interface is an IEEE 1149.7 test interface, the second logic may use the test clock input and the first test mode connector as a bidirectional connection via the processor test mode connector. In any of the disclosed embodiments of the processor, the first test access port may output a mode select output signal to the first finite state machine based on an instruction received at the processor test mode connector, the mode select output signal indicating to the first finite state machine that the first test access port is implementing one of the JTAG test interface and the serial wire debug test interface.

In any of the disclosed embodiments of the processor, the first finite state machine may transition from the JTAG state to the serial wire debug state based on the mode select output from the first test access port. In the processor, when the test interface is a serial wire debug test interface, the third logic may use the test clock input and the first test mode connector as a bidirectional connection via the processor test mode connector to implement the serial wire debug test interface.

In any of the disclosed embodiments of the processor, each of the plurality of test access ports may be individually accessible using at least one of a test clock connector pin on the processor, a test data in connector pin on the processor, a test data out connector pin on the processor, and the processor test mode connector. In the processor, the processor may further include a debug instruction register including a fifth logic to control each of the plurality of test access ports respectively associated with a plurality of finite state machines. In the processor, the plurality of finite state machines may include the first finite state machine.

In any of the disclosed embodiments of the processor, the lock register may further include a plurality of bits corresponding to the plurality of test access ports, and a sixth logic to use a set bit in the lock register to determine which of the plurality of test access ports connects a test data output to the test data output connector.

In any of the disclosed embodiments of the processor, the first finite state machine may include a seventh logic to implement a bypass state reachable from a release state, the bypass state to indicate that the plurality of test access ports is idle, and the processor test mode connector is disconnected to the plurality of test access ports. In any of the disclosed embodiments of the processor, the first finite state machine may include an eighth logic to implement the release state reachable from the JTAG state and the serial wire debug state, the release state to indicate that the processor test mode connector is disconnected from the first test access port, the lock register is cleared, and the first finite state machine is transitioning to the bypass state.

A method may include, within a processor, controlling a plurality of test access ports respectively including a plurality of finite state machines, including controlling states in the plurality of finite state machines. In the method, the plurality of test access ports may include a first test access port. In the method, the first test access port may include a test clock input, a test data input, a test data output, a lock register controlling selection of the test data output to a test data output connector pin on the processor, a first test mode connector, and a first finite state machine coupled to a processor test mode connector on the processor, the first finite state machine included in the plurality of finite state machines. In the method, controlling states in the plurality of finite state machines may include enabling, by the first finite state machine, the first test access port to implement a Joint Test Action Group (JTAG) test interface, and implement a serial wire debug test interface.

In any of the disclosed embodiments, the method may include enabling, by the first finite state machine, the first test access port to implement a JTAG IEEE 1149.1 test interface using the test clock input, the test data input, the first test mode connector as an input from the processor test mode connector, and the test data output. In any of the disclosed embodiments, the method may include enabling, by the first finite state machine, the first test access port to implement a JTAG IEEE 1149.7 test interface using the test clock input and the first test mode connector as a bidirectional connection via the processor test mode connector. In any of the disclosed embodiments, the method may include outputting, by the first test access port, a mode select output signal to the first finite state machine based on an instruction received at the processor test mode connector, the mode select output signal indicating to the first finite state machine that the first test access port is implementing one of the JTAG test interface and the serial wire debug test interface.

In any of the disclosed embodiments, the method may include transitioning, by the first finite state machine, from the JTAG state to the serial wire debug state based on the mode select output from the first test access port. In any of the disclosed embodiments, the method may include enabling, by the first finite state machine, the first test access port to implement the serial wire debug test interface using the test clock input and the first test mode connector as a bidirectional connection via the processor test mode connector.

In any of the disclosed embodiments, the method may include individually accessing each of the plurality of test access ports using at least one of a test clock connector pin on the processor, a test data in connector pin on the processor, a test data out connector pin on the processor, and the processor test mode connector.

In any of the disclosed embodiments of the method, the lock register may include a plurality of bits corresponding to the plurality of test access ports. In any of the disclosed embodiments, the method may include, based on a set bit in the lock register, determining which of the plurality of test access ports connects a test data output to the test data output connector pin.

In any of the disclosed embodiments of the method, the first finite state machine may include a bypass state reachable from a release state, the bypass state to indicate that the plurality of test access ports is idle, and the processor test mode connector is not connected to the plurality of test access ports. In any of the disclosed embodiments of the method, the first finite state machine may include a JTAG state reachable from the bypass state, the JTAG state to indicate that the first test access port is implementing the JTAG test interface.

In any of the disclosed embodiments of the method, the first finite state machine may include a serial wire debug state reachable from the JTAG state, the serial wire debug state to indicate that the first test access port is implementing the serial wire debug test interface.

In any of the disclosed embodiments of the method, the first finite state machine may include the release state reachable from the JTAG state and the serial wire debug state, the release state to indicate that the processor test mode connector is disconnected from the first test access port, the lock register is cleared, and the first finite state machine transitions to the bypass state.

A system may include processor including a test data output connector, a processor test mode connector, and a plurality of test access ports including a first test access port. In the system, the first test access port may include a test clock input, a test data input, a test data output, a lock register including a first logic to control selection of the test data output to the test data output connector, a first test mode connector, and a first finite state machine coupled to the processor test mode connector. In the system, the first finite state machine may include a second logic to implement a Joint Test Action Group (JTAG) state to enable the first test access port to implement a JTAG test interface, and a third logic to implement a serial wire debug state to enable the first test access port to implement a serial wire debug test interface.

In any of the disclosed embodiments of the system, when the JTAG test interface is an IEEE 1149.1 test interface, the second logic may use the test clock input, the test data input, the first test mode connector as an input from the processor test mode connector, and the test data output. In any of the disclosed embodiments of the system, when the JTAG test interface is an IEEE 1149.7 test interface, the second logic may use the test clock input and the first test mode connector as a bidirectional connection via the processor test mode connector. In any of the disclosed embodiments of the processor, the first test access port may output a mode select output signal to the first finite state machine based on an instruction received at the processor test mode connector, the mode select output signal indicating to the first finite state machine that the first test access port is implementing one of the JTAG test interface and the serial wire debug test interface.

In any of the disclosed embodiments of the system, the first finite state machine may transition from the JTAG state to the serial wire debug state based on the mode select output from the first test access port. In the system, when the test interface is a serial wire debug test interface, the third logic may use the test clock input and the first test mode connector as a bidirectional connection via the processor test mode connector to implement the serial wire debug test interface.

In any of the disclosed embodiments of the system, each of the plurality of test access ports may be individually accessible using at least one of a test clock connector pin on the system, a test data in connector pin on the system, a test data out connector pin on the system, and the processor test mode connector. In the system, the processor may further include a debug instruction register including a fifth logic to control each of the plurality of test access ports respectively associated with a plurality of finite state machines. In the system, the plurality of finite state machines may include the first finite state machine.

In any of the disclosed embodiments of the system, the lock register may further include a plurality of bits corresponding to the plurality of test access ports, and a sixth logic to use a set bit in the lock register to determine which of the plurality of test access ports connects a test data output to the test data output connector.

In any of the disclosed embodiments of the system, the first finite state machine may include a seventh logic to implement a bypass state reachable from a release state, the bypass state to indicate that the plurality of test access ports is idle, and the processor test mode connector is disconnected to the plurality of test access ports. In any of the disclosed embodiments of the system, the first finite state machine may include an eighth logic to implement the release state reachable from the JTAG state and the serial wire debug state, the release state to indicate that the processor test mode connector is disconnected from the first test access port, the lock register is cleared, and the first finite state machine is transitioning to the bypass state.

Thus, techniques for performing one or more instructions according to at least one embodiment are disclosed. While certain exemplary embodiments have been described and shown in the accompanying drawings, it is to be understood that such embodiments are merely illustrative of and not restrictive on other embodiments, and that such embodiments not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:
1. A processor, comprising:
a set of input pins comprising a test mode selector pin;
a set of output pins comprising a test data output pin;
a plurality of finite state machine blocks; and
a plurality of test access ports, wherein each of the plurality of test access ports comprises:
  a respective test clock input;
  a respective test data input;
  a respective test data output;
  a respective lock register including circuitry to control selection of the test data output to the test data output pin; and
  a respective test mode connector, wherein each of the test clock inputs of the plurality of test access ports is connected to a test clock pin in the set of input pins, each of the test data inputs of the plurality of test access ports is connected to a test data input pin in the set of input pins, and each of the test data outputs of the plurality of test access ports is connected to the test data output pin in the set of output pins;
wherein each of the test mode connectors of the plurality of test access ports connects the corresponding test access port to a respective one of the plurality of finite state machine blocks, and
wherein each one of the plurality of finite state machine blocks comprises:
  circuitry to implement a Joint Test Action Group (JTAG) state to enable the corresponding test access port to implement a JTAG test interface; and circuitry to implement a serial wire debug state to enable the corresponding test access port to implement a serial wire debug test interface.

2. The processor of claim 1, wherein:
when the JTAG test interface is an IEEE 1149.1 test interface, the circuitry to implement the JTAG state is to use the test clock input, the test data input, the test mode connector as an input from the processor test mode pin, and the test data output;
when the JTAG test interface is an IEEE 1149.7 test interface, the circuitry to implement the JTAG state is to use the test clock input and the test mode connector as a bidirectional connection via the processor test mode pin; and
the test access ports are to output a mode select output signal to the connected finite state machine based on an instruction received at the processor test mode pin, the mode select output signal to indicate to the connected finite state machine that the corresponding test access port is to implement one of the JTAG test interface and the serial wire debug test interface.

3. The processor of claim 2, wherein:
the finite state machine blocks are to transition from the JTAG state to the serial wire debug state based on the mode select output from the corresponding test access port; and
when the test interface is a serial wire debug test interface, the circuitry to implement the serial wire debug state is to use the test clock input and the test mode connector as a bidirectional connection via the processor test mode pin to implement the serial wire debug test interface.

4. The processor of claim 1, wherein
the processor further includes a debug instruction register to control each of the plurality of test access ports respectively associated with one of the plurality of finite state machines.

5. The processor of claim 1, wherein the lock register further includes:
a plurality of bits corresponding to the plurality of test access ports; and
circuitry to use a set bit in the lock register to determine which of the plurality of test access ports connects a test data output to the test data output pin.

6. The processor of claim 1, wherein each of the plurality of finite state machine blocks includes:
circuitry to implement a bypass state reachable from a release state, the bypass state to indicate that:
the plurality of test access ports is idle; and
the processor test mode pin is disconnected from the plurality of test access ports; and
circuitry to implement the release state reachable from the JTAG state and the serial wire debug state, the release state to indicate that:
the processor test mode pin is disconnected from the corresponding test access port;
the lock register is cleared; and
the corresponding finite state machine block transitions to the bypass state.

7. A method comprising, within a processor:
controlling a plurality of test access ports of the processor, wherein each of the plurality of test access ports is respectively associated within one of a plurality of finite state machine blocks of the processor, and controlling the plurality of test access ports comprises controlling states in the plurality of finite state machines, wherein each of the plurality of test access ports comprises:
a respective test clock input;
a respective test data input;
a respective test data output;
a respective lock register controlling selection of the test data output to a test data output connector pin on the processor; and
a respective test mode connector, wherein each of the test clock inputs of the plurality of test access ports is connected to a test clock pin of the processor, each of the test data inputs of the plurality of test access ports is connected to a test data input pin of the processor, and each of the test data outputs of the plurality of test access ports is connected to a test data output pin of the processor;
wherein each of the test mode connectors of the plurality of test access ports connects the corresponding test access port to a respective one of the plurality of finite state machine blocks, and
wherein each one of the plurality of finite state machine blocks is coupled to a respective one of the plurality of test access ports, and each of the plurality of finite state machine blocks is further coupled to a processor test mode pin on the processor; and
wherein the method further comprises enabling, by a corresponding finite state machine block, a particular one of the plurality of test access ports to:
implement a Joint Test Action Group (JTAG) test interface; and
implement a serial wire debug test interface.

8. The method of claim 7, further comprising:
enabling, by the corresponding finite state machine block, the particular test access port to implement a JTAG IEEE 1149.1 test interface using the test clock input, the test data input, the test mode connector, and the test data output of the particular test access point;
enabling, by the corresponding finite state machine block, the particular test access port to implement a JTAG IEEE 1149.7 test interface using the test clock input and the test mode connector of the particular test access point as a bidirectional connection via the processor test mode pin; and
outputting, by the particular test access port, a mode select output signal to the corresponding finite state machine block based on an instruction received at the processor test mode connector, the mode select output signal indicating to the corresponding finite state machine block that the corresponding test access port is implementing one of the JTAG test interface and the serial wire debug test interface.

9. The method of claim 8, further comprising:
transitioning, by the corresponding finite state machine, from the JTAG state to the serial wire debug state based on the mode select output from the particular test access port; and
enabling, by the corresponding finite state machine, the particular test access port to implement the serial wire debug test interface using the test clock input and the test mode connector of the particular test access port as a bidirectional connection via the processor test mode pin.

10. The method of claim 7, further comprising individually accessing each of the plurality of test access ports using at least one of:
the test clock pin on the processor;

the test data input pin on the processor;
the test data output pin on the processor; and
the processor test mode pin.

11. The method of claim 7, wherein:
the lock register includes a plurality of bits corresponding to the plurality of test access ports; and
the method further comprises, based on a set bit in the lock register, determining which of the plurality of test access ports connects a corresponding one of the test data outputs of the plurality of test access ports to the test data output pin.

12. The method of claim 7, wherein the finite state machine blocks define state machine with states including:
a bypass state reachable from a release state, the bypass state to indicate that:
the plurality of test access ports is idle; and
the processor test mode pin is not connected to the plurality of test access ports; and
a JTAG state reachable from the bypass state, the JTAG state to indicate that the corresponding test access port is implementing the JTAG test interface.

13. The method of claim 12, wherein the states further include a serial wire debug state reachable from the JTAG state, the serial wire debug state to indicate that the corresponding test access port is implementing the serial wire debug test interface.

14. The method of claim 13, wherein the states further include the release state reachable from the JTAG state and the serial wire debug state, the release state to indicate that:
the processor test mode connector is disconnected from the corresponding test access port;
the lock register is cleared; and
the finite state machine is transitioning to the bypass state.

15. A system comprising a processor, the processor comprising:
a test clock pin;
a test data input pin;
a test data output pin;
a processor test mode pin;
a plurality of finite state machine blocks; and
a plurality of test access ports, wherein each of the plurality of test access ports comprises:
a respective test clock input;
a respective test data input;
a respective test data output;
a respective lock register including circuitry to control selection of the test data output to the test data output pin; and
a respective test mode connector, wherein each of the test clock inputs of the plurality of test access ports is connected to the test clock pin, each of the test data inputs of the plurality of test access ports is connected to the test data input pin, and each of the test data outputs of the plurality of test access ports is connected to the test data output pin;
wherein each of the test mode connectors of the plurality of test access ports connects the corresponding test access port to a respective one of the plurality of finite state machine blocks, and
wherein each one of the plurality of finite state machine blocks comprises:

circuitry to implement a Joint Test Action Group (JTAG) state to enable the corresponding test access port to implement a JTAG test interface; and
circuitry to implement a serial wire debug state to enable the corresponding test access port to implement a serial wire debug test interface.

16. The system of claim 15, wherein:
when the JTAG test interface is an IEEE 1149.1 test interface, the circuitry to implement the JTAG state is to use the test clock input, the test data input, the test mode connector as an input from the processor test mode pin, and the test data output;
when the JTAG test interface is an IEEE 1149.7 test interface, the circuitry to implement the JTAG state is to use the test clock input and the test mode connector as a bidirectional connection via the processor test mode pin; and
the test access ports are to output a mode select output signal to the connected finite state machine based on an instruction received at the processor test mode pin, the mode select output signal to indicate to the connected finite state machine that the corresponding test access port is to implement one of the JTAG test interface and the serial wire debug test interface.

17. The system of claim 16, wherein:
the finite state machine blocks are to transition from the JTAG state to the serial wire debug state based on the mode select output from the corresponding test access port; and
when the test interface is a serial wire debug test interface, the circuitry to implement the serial wire debug state is to use the test clock input and the test mode connector as a bidirectional connection via the processor test mode pin to implement the serial wire debug test interface.

18. The system of claim 15, wherein
the processor further includes a debug instruction register to control each of the plurality of test access ports respectively associated with one of the plurality of finite state machines.

19. The system of claim 15, wherein the lock register further includes:
a plurality of bits corresponding to the plurality of test access ports; and
circuitry to use a set bit in the lock register to determine which of the plurality of test access ports connects a test data output to the test data output pin.

20. The system of claim 15, wherein each of the plurality finite state machine blocks includes:
circuitry to implement a bypass state reachable from a release state, the bypass state to indicate that:
the plurality of test access ports is idle; and
the processor test mode pin is disconnected from the plurality of test access ports; and
circuitry to implement the release state reachable from the JTAG state and the serial wire debug state, the release state to indicate that:
the processor test mode pin is disconnected from the corresponding test access port;
the lock register is cleared; and
the corresponding finite state machine block is transitioning to the bypass state.

* * * * *